US010957784B2

(12) United States Patent
Wong et al.

(10) Patent No.: US 10,957,784 B2
(45) Date of Patent: Mar. 23, 2021

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: I-Hsieh Wong, Kaohsiung (TW); Samuel C. Pan, Hsinchu (TW); Chee-Wee Liu, Taipei (TW); Huang-Siang Lan, Kaohsiung (TW); Chung-En Tsai, Zhubei (TW); Fang-Liang Lu, New Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/450,637

(22) Filed: Jun. 24, 2019

(65) Prior Publication Data
US 2019/0312132 A1    Oct. 10, 2019

Related U.S. Application Data

(63) Continuation of application No. 15/940,423, filed on Mar. 29, 2018, now Pat. No. 10,332,985.
(Continued)

(51) Int. Cl.
*H01L 29/66* (2006.01)
*H01L 21/306* (2006.01)
(Continued)

(52) U.S. Cl.
CPC ........ *H01L 29/66795* (2013.01); *B82Y 10/00* (2013.01); *H01L 21/02532* (2013.01);
(Continued)

(58) Field of Classification Search
CPC ......... H01L 29/66795; H01L 29/42392; H01L 21/30604; H01L 21/268; H01L 21/02532;
(Continued)

(56) References Cited

U.S. PATENT DOCUMENTS 8,753,942 B2 * 6/2014 Kuhn .................... B82Y 10/00
                                                        438/285
9,236,267 B2   1/2016 De et al.
(Continued)

OTHER PUBLICATIONS

C. Dupre et al., "15nm-diameter 3D Stacked Nanowires with Independent Gates Operations: FET".
(Continued)

*Primary Examiner* — Vu A Vu
(74) *Attorney, Agent, or Firm* — McDermott Will & Emery LLP

(57) ABSTRACT

A method of manufacturing a semiconductor device includes forming a fin structure having a stack of alternating first semiconductor layers and second semiconductor layers on a substrate. The first and second semiconductor layers include first end portions on either side of a second portion along a length of the first and second semiconductor layers. The first and second semiconductor layers are formed of different materials. The second portion of the first semiconductor layers is removed to form spaces. A mask layer is formed over the second portion of an uppermost second semiconductor layer above the spaces. The first portions of first and second semiconductor layers are irradiated with radiation from a radiation source to cause material from the first portions of the first and second semiconductor layers to combine with each other.

20 Claims, 25 Drawing Sheets

Related U.S. Application Data

(60) Provisional application No. 62/553,010, filed on Aug. 31, 2017.

(51) Int. Cl.

| | | |
|---|---|---|
| *H01L 21/268* | (2006.01) | |
| *H01L 21/02* | (2006.01) | |
| *H01L 29/08* | (2006.01) | |
| *H01L 21/324* | (2006.01) | |
| *H01L 29/423* | (2006.01) | |
| *H01L 29/06* | (2006.01) | |
| *H01L 29/78* | (2006.01) | |
| *H01L 29/165* | (2006.01) | |
| *H01L 29/775* | (2006.01) | |
| *H01L 29/786* | (2006.01) | |
| *B82Y 10/00* | (2011.01) | |
| *H01L 29/40* | (2006.01) | |
| *H01L 29/10* | (2006.01) | |
| *H01L 21/265* | (2006.01) | |
| *H01L 21/762* | (2006.01) | |

(52) U.S. Cl.
CPC ...... *H01L 21/02535* (2013.01); *H01L 21/268* (2013.01); *H01L 21/30604* (2013.01); *H01L 21/324* (2013.01); *H01L 29/0673* (2013.01); *H01L 29/0847* (2013.01); *H01L 29/165* (2013.01); *H01L 29/401* (2013.01); *H01L 29/42392* (2013.01); *H01L 29/66439* (2013.01); *H01L 29/66545* (2013.01); *H01L 29/66742* (2013.01); *H01L 29/66772* (2013.01); *H01L 29/775* (2013.01); *H01L 29/785* (2013.01); *H01L 29/7848* (2013.01); *H01L 29/78654* (2013.01); *H01L 29/78684* (2013.01); *H01L 29/78696* (2013.01); *H01L 21/26513* (2013.01); *H01L 21/76224* (2013.01); *H01L 29/0649* (2013.01); *H01L 29/1083* (2013.01)

(58) Field of Classification Search
CPC ............ H01L 29/785; H01L 29/7848; H01L 29/0673; H01L 29/165; H01L 21/324; H01L 29/0847; H01L 21/02535; H01L 29/1083; H01L 21/26513; H01L 29/66545; H01L 29/0649; H01L 21/76224

USPC ........................................... 438/283

See application file for complete search history.

(56) References Cited

U.S. PATENT DOCUMENTS

| | | |
|---|---|---|
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,748,404 B1 | 8/2017 | Chang et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2014/0217502 A1 | 8/2014 | Chang et al. |
| 2015/0053263 A1 | 2/2015 | Imamura et al. |
| 2015/0069473 A1* | 3/2015 | Glass ................ H01L 21/02175 257/288 |
| 2016/0211261 A1 | 7/2016 | Liu et al. |
| 2017/0352662 A1* | 12/2017 | Xu ...................... H01L 27/0924 |
| 2018/0151732 A1* | 5/2018 | Mehandru ............... H01L 29/78 |
| 2018/0331195 A1* | 11/2018 | Rachmady ........ H01L 29/66477 |

OTHER PUBLICATIONS

S. Barraud et al., "Vertically Stacked-Nan Wires MOSFETs in a Replacement Metal Gate Process with Inner Spacer and SiGe Source/Drain", IEEE< IEDM, vol. 16, No. 464, pp. 71.6.1-17.6.4.

I-Hsieh Wong et al., "High Performance Ge Junctionless Gate-all-around NFETs with Simultaneous Ion=1235uA/um at Vov-Vdc-IV, SS=95 mV/dec, high Ion/Ion=2×106, and Reduced Noise Power Density using S/D Dopant Recovery by Selective Laser Annealing", IEEE, IEDM, vol. 16, No. 842, pp. 33.6.1-36.6.4.

I-Hsieh Wong et al., "In-situ Doped and Tensity Stained Ge Junctionless Gate-all-around nFETs on SOI Featuring Ion=828 uA/um, Ion/Ioff—1×105, DIBL=16-54 mV/V, and 1.4X External Strain Enhancement", IEEE, IEDM, vol. 14, No. 239, pp. 9.6.1-9.6.4.

S. Hsu et al., "Nearly Defect-free Ge Gate-All-Around FETs on Si Substrates". IEEE, IEDM, vol. 11, No. 825, pp. 35.2.1-35.24.

Non-final Office Action dated Dec. 17, 2018, which issued in related U.S. Appl. No. 15/940,423.

Notice of Allowance dated Apr. 24, 2019, which issued in related U.S. Appl. No. 15/940,423.

* cited by examiner

SEMICONDUCTOR DEVICE AND MANUFACTURING METHOD THEREOF

CROSS-REFERENCE TO RELATED APPLICATIONS

This is a continuation of U.S. patent application Ser. No. 15/940,423 filed Mar. 29, 2018, now U.S. Pat. No. 10,332,985, which claims priority to U.S. Provisional Patent Application 62/553,010 filed Aug. 31, 2017, the entire disclosure of the two applications are incorporated herein by reference.

TECHNICAL FIELD

The disclosure relates to a method of manufacturing semiconductor integrated circuits, and more particularly to method of manufacturing semiconductor devices including gate-all-around field effect transistors (GAA FETs).

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the present disclosure, a method for fabricating a GAA FET and a stacked channel FET are provided. It is noted that in the present disclosure, a source and a drain are interchangeably used and the structures thereof are substantially the same.

The present disclosure provides a simplified process for forming source/drain stressors of stacked gate-all-around FET by selective laser annealing of stacked semiconductor layers. The induced strain in the source/drain stressor can be adjusted by the thickness and the composition of the stacked layers. Compressive and tensile strain can be obtained in the same structure using selective laser annealing. Dopant activation and source/drain stressor formation can be done simultaneously by laser annealing.

Figure 1:
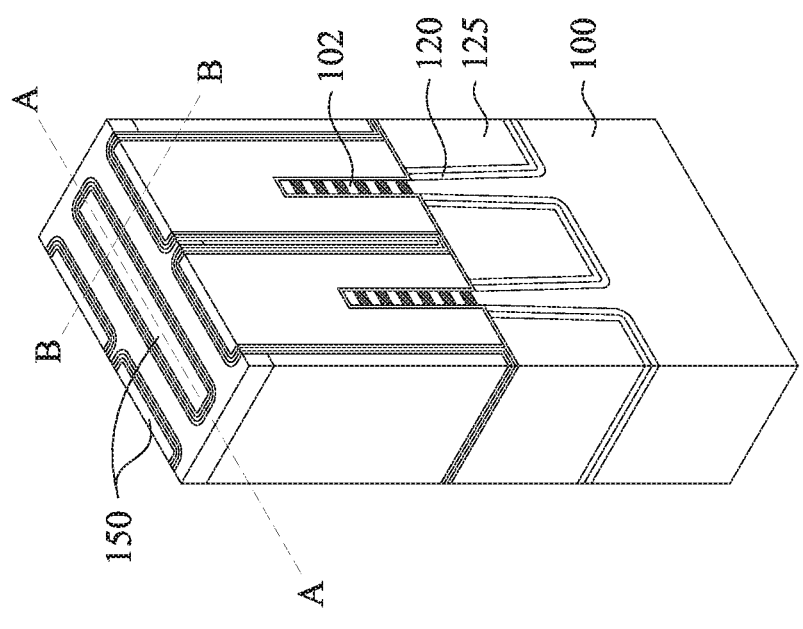
FIG. 1 shows an isometric view of a GAA FET semiconductor device showing one of the stages of a manufacturing process according to an embodiment of the present disclosure.
Figure 1:
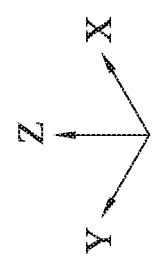

FIG. 1 shows an isometric view of a GAA FET semiconductor device showing one of the stages of a manufacturing process according to an embodiment of the present disclosure. One or more gate electrodes 150 extending in the X-direction are disposed over one or more fin structures 120 extending in the Y-direction. The X-direction is substantially perpendicular to the Y-direction. The fin structures 120 are formed over a semiconductor substrate 100. A lower portion of the fin structure 120 is embedded in an isolation insulating layer 125, and the gate electrode 150 wraps around semiconductor nanowires 102.

Figure 2:
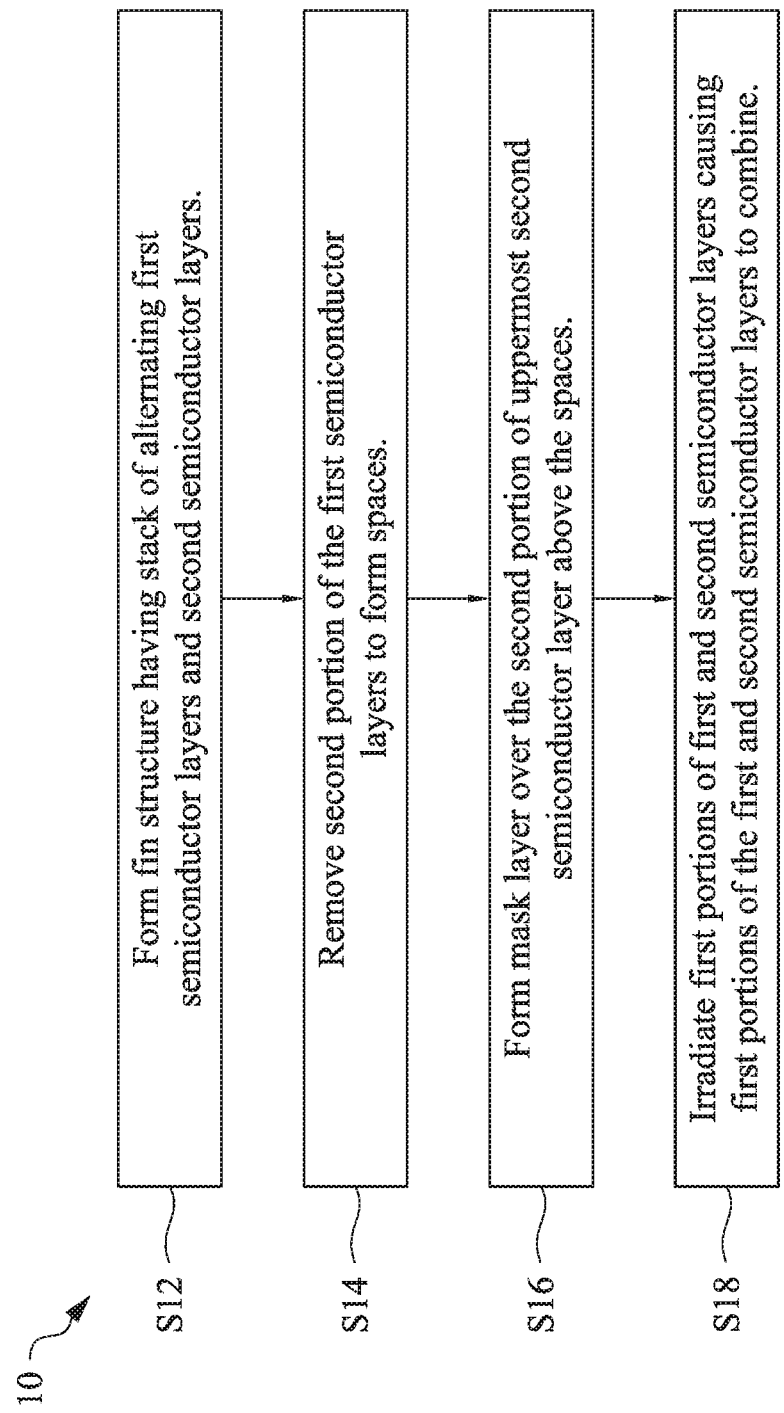
FIG. 2 is a flowchart of a method of manufacturing a semiconductor device according to an embodiment of the present disclosure.

FIG. 2 is a flowchart of a method 10 of manufacturing a semiconductor device according to an embodiment of the present disclosure. A fin structure having a stack of alternating first semiconductor layers and second semiconductor layers is formed over a substrate in operation S12. In some embodiments, the first and second semiconductor layers include first end portions on either side of a second portion along a length of the first and second semiconductor layers. In some embodiments, the first and second semiconductor layers are formed of different materials. Next, in operation S14, the second portion of the first semiconductor layers is removed to form spaces. A mask layer is subsequently formed over the second portion of an uppermost second semiconductor layer above the spaces in operation S16. Then in operation S18, the first portions of first and second semiconductor layers are irradiated with radiation from a radiation source to cause material from the first portions of the first and second semiconductor layers to combine with each other.

FIGS. 3-8 show exemplary sequential processes for manufacturing a GAA FET according to embodiments of the present disclosure, including the method shown in the flowchart of FIG. 2. It is understood that additional operations can be provided before, during, and after processes shown by FIGS. 3-8, and some of the operations described below can be replaced or eliminated, for additional embodiments of the method. The order of the operations/processes may be interchangeable.

Figure 3:
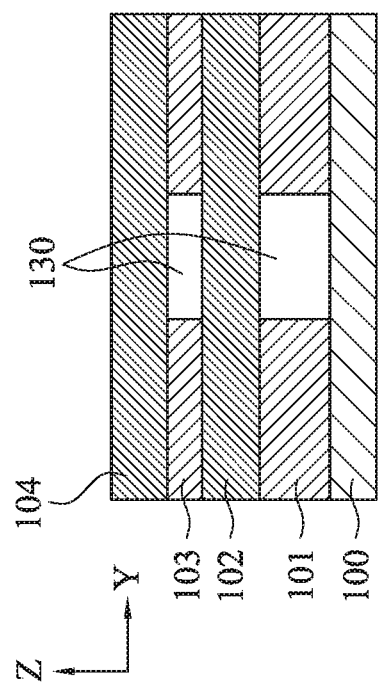
FIG. 3 shows a cross sectional view of one of the various stages of manufacturing a semiconductor FET device according to embodiments of the present disclosure.

FIG. 3 shows a cross sectional view corresponding to line B-B of FIG. 1 of one of the various stages of manufacturing a semiconductor FET device according to embodiments of the present disclosure. As shown in FIG. 3, a semiconductor substrate 100 is provided. In some embodiments, the substrate 100 includes a single crystalline semiconductor layer on at least it surface portion. The substrate 100 may include a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline Si.

The substrate 100 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP.

Impurity ions (dopants) are implanted into the silicon substrate 100 to form a well region (not shown). The ion implantation is performed to prevent a punch-through effect. The substrate 100 may include various regions that have been suitably doped with impurities (e.g., p-type or n-type conductivity). The dopants are, for example, boron ($BF_2$) for an n-type Fin FET and phosphorus for a p-type Fin FET.

In an embodiment of the present disclosure a layer stack is prepared, as shown in FIG. 3. A first semiconductor layer (first buffer layer) 101 is disposed over a substrate 100. A second semiconductor layer (first channel layer) 102 is disposed over the first semiconductor layer 101. Another first semiconductor layer (second buffer layer) 103 is disposed over the second semiconductor layer 102. Another second semiconductor layer (second channel layer) 104 is disposed over the another first semiconductor layer 103.

In some embodiments, the first and second semiconductor layers are alternately stacked such that there are more than two layers each of the first and second semiconductor layers. In some embodiments, each of the second semiconductor layers (which become the nanowires or channel layers) can be formed of different materials. In some embodiments, the lattice constant of the second semiconductor layers is greater than the lattice constant of the first semiconductor layers. In other embodiments, the lattice constant of the second semiconductor layers is smaller than the lattice constant of the first semiconductor layers.

In some embodiments, the first and second semiconductor layers are made of different materials selected from the group consisting of Si, Ge, SiGe, GeSn, Si/SiGe/Ge/GeSn, SiGeSn, and combinations thereof. In some embodiments, the first and second semiconductor layers are formed by epitaxy. In some embodiments, the SiGe is $Si_xGe_{1-x}$, where $0.1 \leq x \leq 0.9$.

In some embodiments, the first semiconductor layers 101, 103 are formed of a first semiconductor material. In some embodiments, the first semiconductor material includes a first Group IV element and a second Group IV element. The Group IV elements are selected from the group consisting of C, Si, Ge, Sn, and Pb. In some embodiments, the first Group IV element is Si and the second Group IV element is Ge. In certain embodiments, the first semiconductor material is $Si_{1-x}Ge_x$, wherein $0.3 \leq x \leq 0.9$, and in other embodiments, $0.4 \leq x \leq 0.7$.

In some embodiments, the second semiconductor layers 102, 104 are formed of a second semiconductor material. In some embodiments, the second semiconductor material includes a first Group IV element and a second Group IV element. In some embodiments, the first Group IV element is Si and the second Group IV element is Ge. In some embodiments, the amounts of the first Group IV element and second Group IV element are different in the second semiconductor material than in the first semiconductor material.

In some embodiments, the amount of Ge in the first semiconductor material is greater than the amount of Ge in the second semiconductor material. In certain embodiments, the second semiconductor material is $Si_{1-y}Ge_y$, wherein $0.1 \leq y \leq 0.5$, and x>y, and in other embodiments, $0.2 \leq y \leq 0.4$.

The first semiconductor layers 101, 103 and second semiconductor layers 102, 104 may be formed by one or more epitaxy or epitaxial (epi) processes. The epitaxy processes include CVD deposition techniques (e.g., vapor-phase epitaxy (VPE) and/or ultra-high vacuum CVD (UHV-CVD)), molecular beam epitaxy, and/or other suitable processes.

In some embodiments, the thickness of the first and second semiconductor layers range from about 3 nm to about 100 nm. In some embodiments, the thickness t2 of the second semiconductor layers and the thickness t1 of the first semiconductor layers are related as t2/t1=0.2 to 5.

Figure 4:
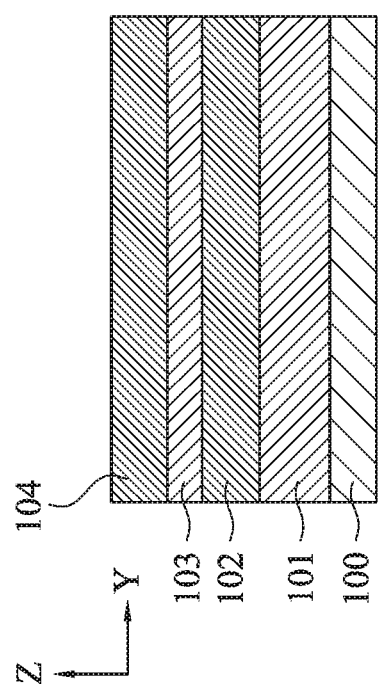
FIG. 4 shows a cross sectional view of one of the various stages of manufacturing a semiconductor FET device according to embodiments of the present disclosure.

The layer stack is patterned to form a fin structure, and then channels are subsequently formed in the layer stack by removing portions of the channel regions of the first semiconductor layers 101, 103, as shown in FIG. 4. In some embodiments, the portions of the channel regions are removed by selectively etching the first semiconductor layers 101, 103 to form spaces 130. In some embodiments, the spaces 130 are formed using suitable photolithographic and etching techniques. In some embodiments, after forming the spaces 130, gate replacement technology is employed. In gate replacement technology, a dummy gate electrode structure, including a polysilicon gate electrode, is formed in the spaces 130, and after subsequent processing is performed on the source/drain regions, the dummy gate electrode structure is removed, and a gate electrode structure is formed in the spaces 130.

In some embodiments, the fin structure includes a plurality of fins, including dummy fins to improve pattern fidelity during processing. In certain embodiments, the first semiconductor layers 101, 103 are selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

Figure 5:
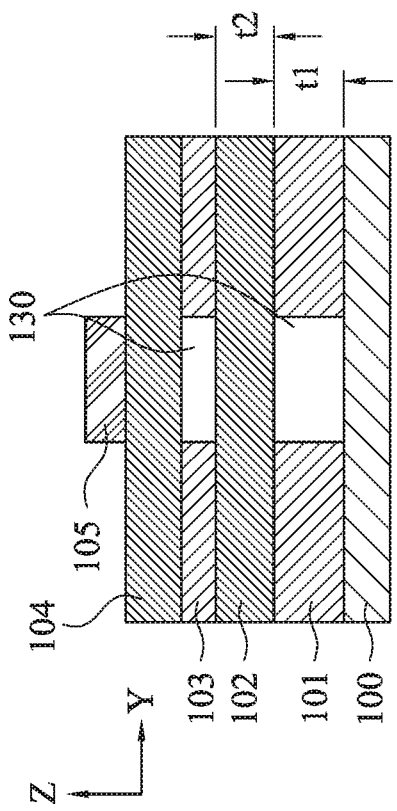
FIG. 5 shows a cross sectional view of one of the various stages of manufacturing a semiconductor FET device according to embodiments of the present disclosure.

A mask layer 105 is subsequently formed over the channel regions of the second semiconductor layers 102, 104, as shown in FIG. 5. The mask layer is made of a reflective material, such as a metal, in some embodiments. In some embodiments, the metal for the mask is selected from the group consisting of aluminum, nickel, gold, platinum, chromium, copper, zinc, and zirconium. The mask layer material may be deposited by CVD, atomic layer deposition (ALD), physical vapor deposition (PVD), electroplating, or other suitable methods, After depositing the mask layer material, the mask layer 105 is formed by suitable photolithographic and etching techniques in some embodiments. The mask layer 105 has a width substantially equal to the channel length, and a thickness of from about 20 nm to about 100 nm in some embodiments.

Figure 6:
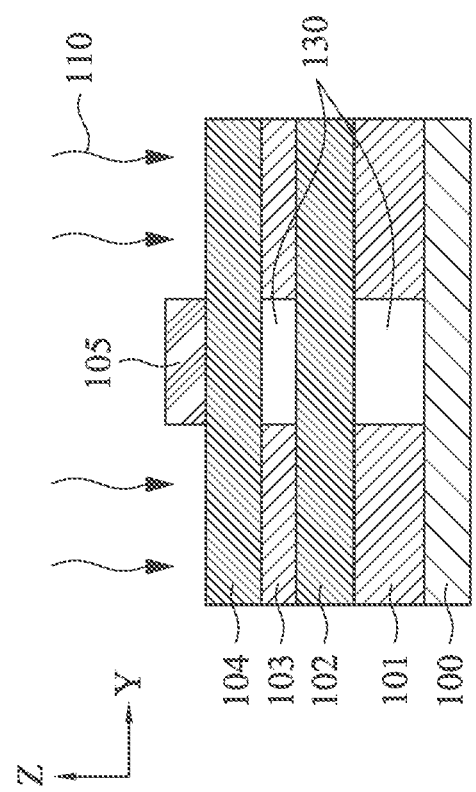
FIG. 6 shows a cross sectional view of one of the various stages of manufacturing a semiconductor FET device according to embodiments of the present disclosure.

The layer stack is subsequently selectively irradiated with radiation 110 from a radiation source, as shown in FIG. 6. In some embodiments, the radiation source is a laser or a flash lamp, including argon and xenon flash lamps. The layer stack is exposed to the radiation 110 for a period of time ranging from greater than 0 s to about 100 ms. In particular, each portion of the layer stack not covered by the reflective mask 105 is exposed for a period of time ranging from greater than 0 s to about 100 ms. In certain embodiments, each portion of the layer stack is exposed to radiation 110 for about 1 ns to about 1 ms. In other embodiments, each portion of the layer stack is exposed to radiation 110 for about 5 ns to about 100 μs. In other embodiments, each portion of the layer stack is exposed to radiation 110 for about 10 ns to about 100 ns. During the exposure to radiation, the exposed portions of the layer stack undergo ultra-rapid heating and reach temperatures of up to 2000° C. In other embodiments, the exposed portions of the layer stack reach temperatures up to 1100° C. Portions of the second semiconductor layers 102, 104 covered by or under the reflective mask 105 are not substantially heated because the reflective mask 105 reflects the radiation.

In some embodiments, the power density of the radiation is about 1 mJ/cm$^2$ to about 900 mJ/cm$^2$. In some embodiments, the radiation 110 is laser radiation from a laser. In some embodiments, the wavelength of the laser radiation ranges from about 150 nm to about 2300 nm. In other embodiments, the wavelength used in the irradiation by the laser is about 193 nm to about 1878 nm ($\lambda$=1878 nm is equivalent to the bandgap of Ge). In certain embodiments, a laser beam having a wavelength of about 532 nm is used. In some embodiments, the power density used in laser annealing is about 1 mJ/cm$^2$ to about 900 mJ/cm$^2$. In certain embodiments, the power density of the radiation 110 ranges from about 250 mJ/cm$^2$ to about 300 mJ/cm$^2$. In certain embodiments, dynamic surface annealing occurs during the exposure to radiation. In dynamic surface annealing, the activation of the doped regions of the exposed semiconductor layer occurs without diffusion of the dopants. In some embodiments, the full-width-at-half-maximum (FWHM) of the laser pulse is about 1 ns to about 1 ms. A particular spot on the layer stack is exposed to the laser beam from about 10 ns to about 100 μs in some embodiments. The shape of laser beam can be any shape including linear, elliptical, circular, etc.

In a certain embodiment, the laser radiation has a wavelength of about 532 nm, and the fluence of the laser radiation ranges from about 10 to about 80 mJ/cm$^2$. Because the mask layer 105 blocks or reflects the radiation 110, the source/drain regions of the layer stack are selectively irradiated with the radiation. The irradiation can be performed in ambient air, clean dry air, $N_2$, $N_2$+$H_2$, $H_2$, or inert gas (e.g.—He, Ne, and Ar).

Figure 7:
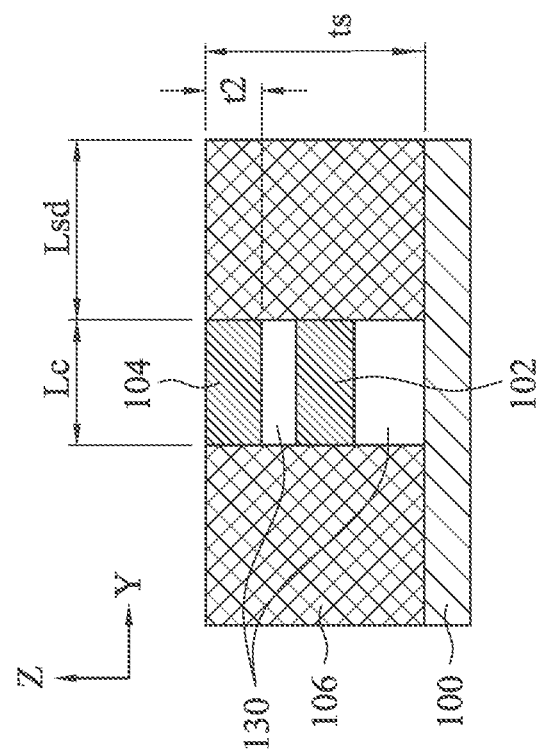
FIG. 7 shows a cross sectional view of one of the various stages of manufacturing a semiconductor FET device according to embodiments of the present disclosure.

The radiation 110 anneals the source/drain regions of the fin structure causing the first semiconductor layers 101, 103 and the second semiconductor layers 102, 104 to combine and form a source/drain stressor region 106, as shown in FIG. 7. For example, if the first semiconductor layers 101, 103 comprise SiGe and the second semiconductor layers 102, 104 comprise Ge, the laser annealing causes Si from the SiGe layers to diffuse into the Ge layers thereby creating the SiGe stressor region 106. In some embodiments, the stressor region 106 has a substantially uniform composition ($Si_xGe_{1-x}$, where x is constant within the source/drain region), and in other embodiments, the composition of the stressor region 106 is graded ($Si_xGe_{1-x}$, where x varies from 0 to 1 across the thickness of the stressor region). In some embodiments, the thickness is of the source/drain stressor region and the thickness t2 of the second semiconductor layers are related is/t2=(0.15 to 6)*n, where n=the number of second semiconductor layers (to be used as channel layers).

In some embodiments, the source/drain regions are doped with an appropriate dopant prior to laser annealing. In such embodiments, the laser annealing additionally activates the dopants in the source/drain regions. In certain embodiments, the source/drain regions are doped with up to 2×10$^{20}$ dopants/cm$^3$. The dopants can be n-type or p-type dopants, including one or more of As, Sb, P, B, Ga, and Al. In some embodiments, in-situ doping is used to incorporate the dopant when the first and/or second semiconductor layers are epitaxially formed. In other embodiments, ion-implantation, plasma-doping, solid-phase doping, or other doping techniques are used.

In some embodiments, the channel length Lc is about 10 nm to about 50 nm, and the length Lsd of each source/drain stressor is about 50 nm to about 100 nm.

Figure 8:
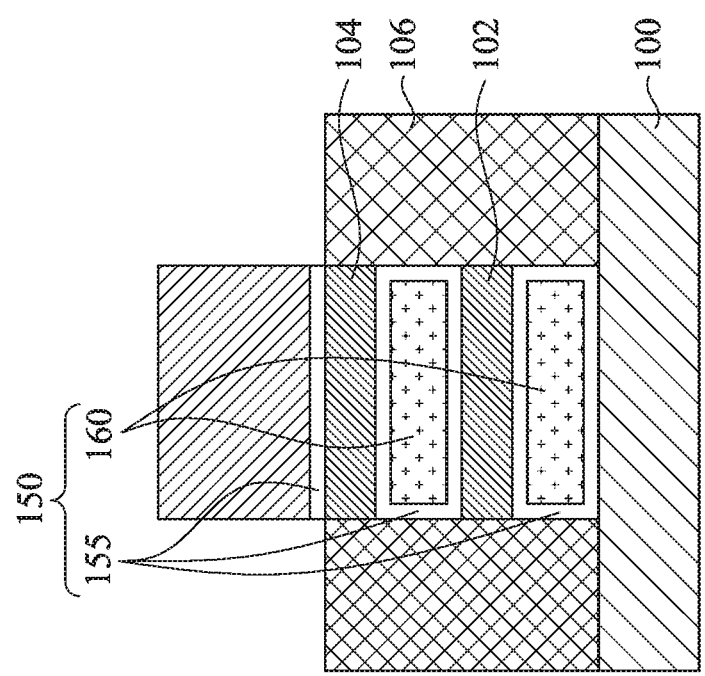
FIG. 8 shows a cross sectional view of one of the various stages of manufacturing a semiconductor FET device according to embodiments of the present disclosure.

After the irradiation, the mask layer 105 is removed using a suitable etching technique and additional processing is performed. Additional processing includes forming a gate electrode structure 150 wrapping around the nanowires 102, 104 in the channel region to form a gate all around field effect transistor (GAA FET), as shown in FIG. 8. The gate electrode structure 150 includes a gate dielectric layer 155 wrapping around the nanowires 102, 104 and a gate electrode layer 160 disposed on the gate dielectric layer wrapping around the nanowires. In some embodiments, an interfacial layer and work function adjustment layers are formed between the gate dielectric layer 155 and the gate electrode layer 160.

In certain embodiments, the gate dielectric layer 155 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 155 may be formed by CVD, ALD, or any suitable method. In one embodiment, the gate dielectric layer 155 is formed using a highly conformal deposition process such as ALD in order to ensure the formation of a gate dielectric layer having a uniform thickness around each channel layers. The thickness of the gate dielectric layer 155 is in a range from about 1 nm to about 6 nm in some embodiments.

The gate electrode layer 160 is formed on the gate dielectric layer 155 to surround each channel layer. The gate electrode layer 160 includes one or more layers of conductive material, such as polysilicon; or a metal, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 160 may be formed by CVD, ALD, electroplating, or other suitable methods.

In certain embodiments of the present disclosure, one or more work function adjustment layers (not shown) are interposed between the gate dielectric layer 155 and the gate electrode layer 160. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For an n-channel FET, one or more of TaN, TaAlC, TiN, TiC, Co, TiAl, HfTi, TiSi and TaSi is used as the work function adjustment layer, and for a p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 9:
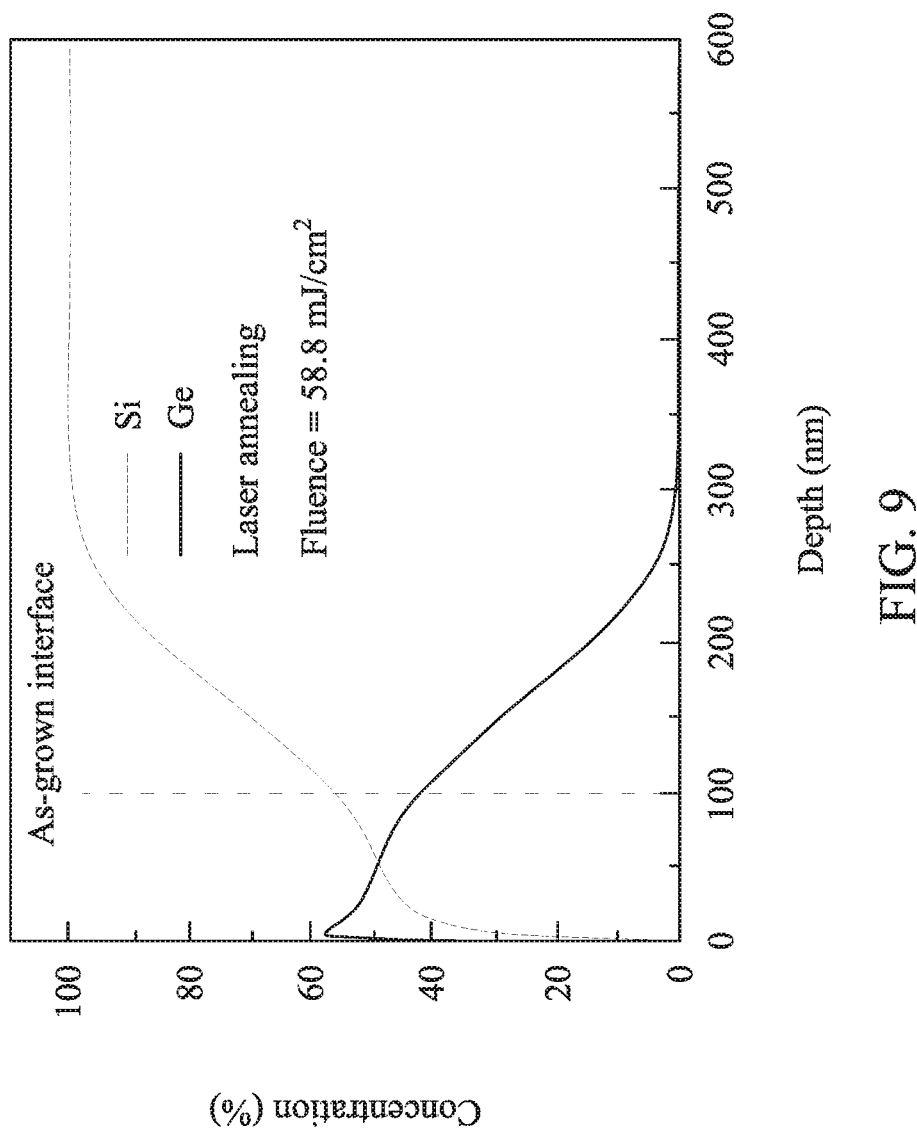
FIG. 9 shows Si/Ge intermixing in source/drain stressor regions according to embodiments of the disclosure.
Figure 10:
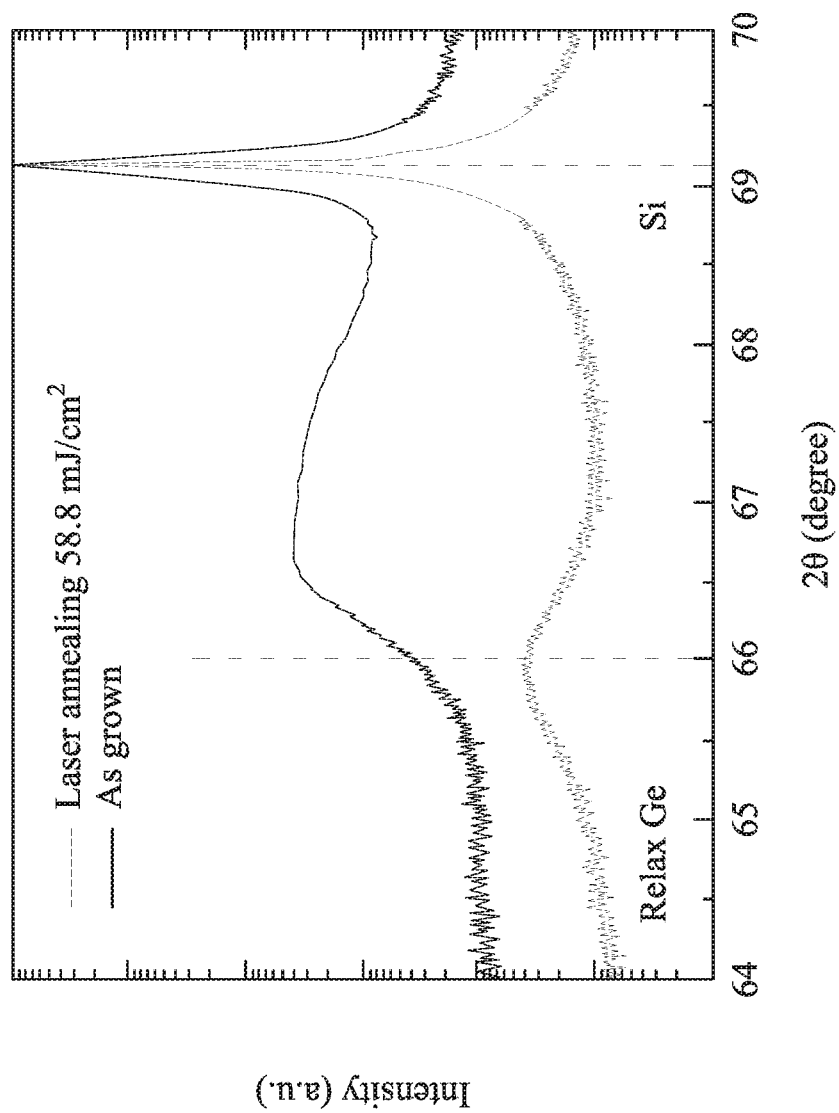
FIG. 10 shows Ge layers transformed into SiGe by X-ray diffraction according to some embodiments of the disclosure.

As shown in FIG. 9, Si/Ge intermixing in the source/drain stressor regions is observed by Secondary Ion Mass Spectroscopy (SIMS) measurement after laser annealing of a Ge layer formed on an Si layer. In addition, as shown in FIG. 10, X-Ray Diffraction (XRD) shows the as-grown pure Ge layer is transformed into SiGe in the source/drain stressor layer after laser annealing, signifying that Si has diffused into the Ge layer.

Figure 11:
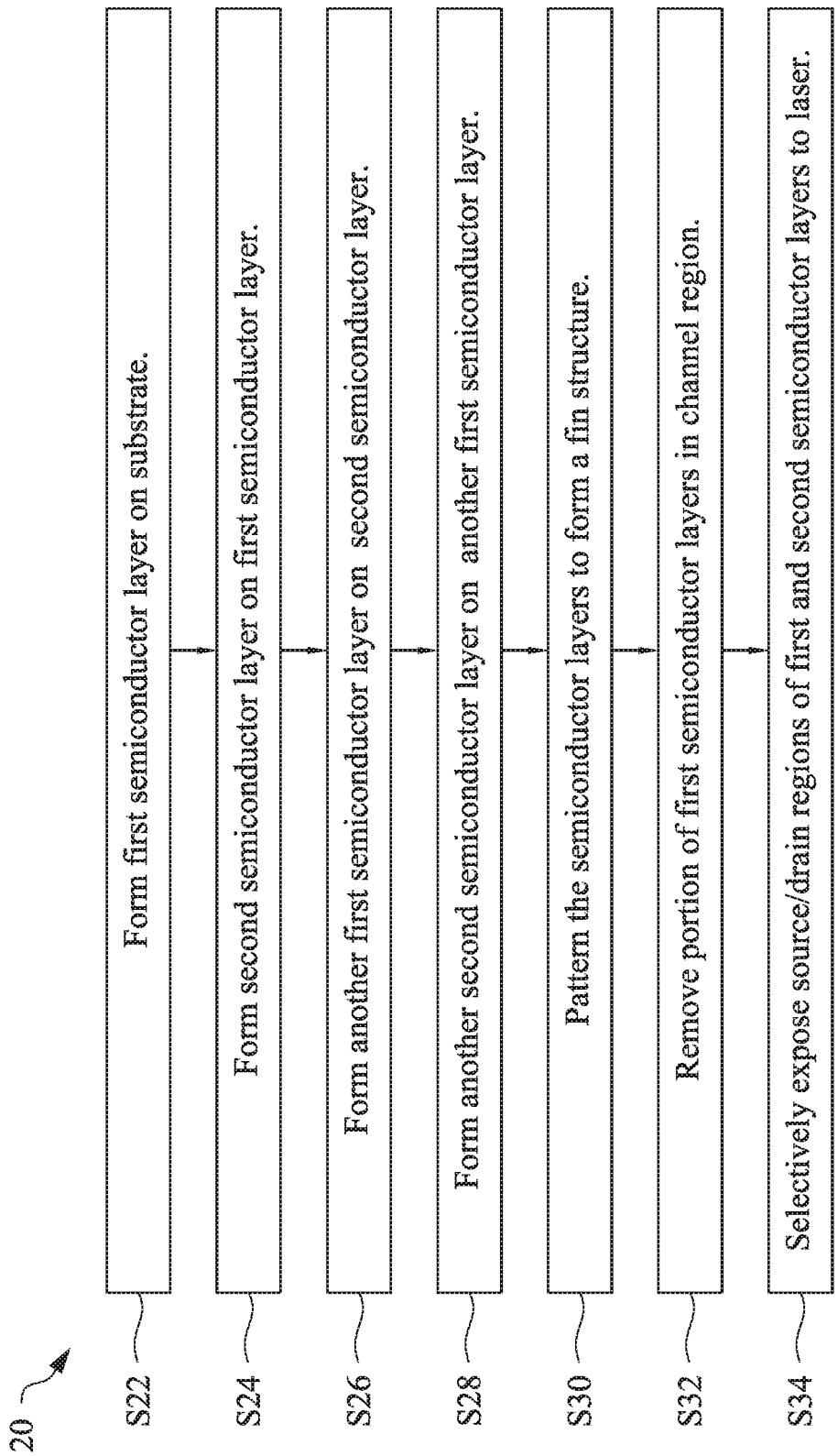
FIG. 11 is a flowchart of a method of manufacturing a semiconductor device according to an embodiment of the present disclosure.

FIG. 11 is a flowchart of another method 20 of manufacturing a semiconductor device according to an embodiment of the present disclosure. A first semiconductor layer is formed on a substrate in operation S22, and a second semiconductor layer is formed on the first semiconductor layer in operation S24. In operation S26, another first semiconductor layer is formed on the second semiconductor layer, and in operation S28 another second semiconductor layer is formed on the another first semiconductor layer. The first and second semiconductor layers are formed of different materials. Next, the semiconductor layers are patterned to form a fin structure in operation S30. The fin structure includes a channel region and source/drain regions on each side of the channel regions. A portion of the first semiconductor layers is subsequently removed in the channel region in operation S32, and the source/drain regions of the first and second semiconductor layers are selectively exposed to laser radiation in operation S34.

Figure 12:
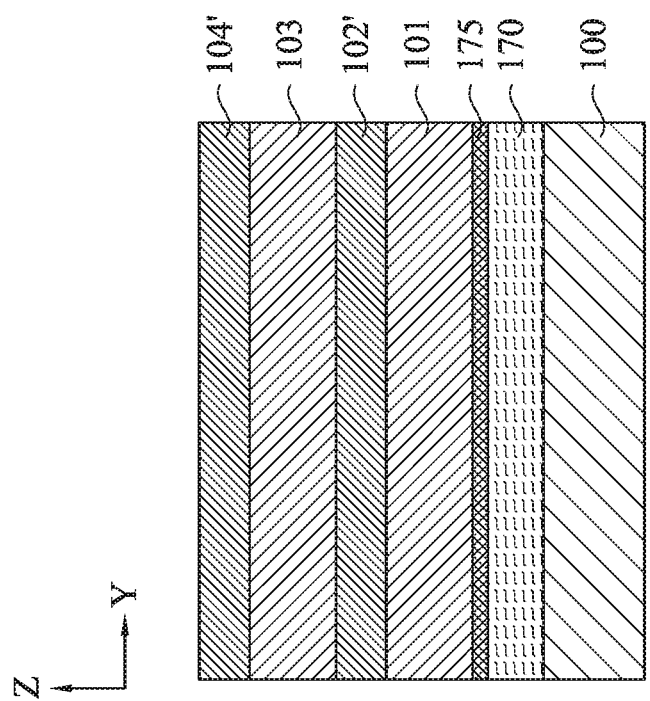
FIG. 12 shows a cross sectional view of one of the various stages of manufacturing a semiconductor FET device according to embodiments of the present disclosure.

FIGS. 12-17 show exemplary sequential processes for manufacturing a GAA FET according to embodiments of the present disclosure, including the method shown in the flowchart of FIG. 11. A fin structure having a layer stack of alternating layers of a relaxed first semiconductor layer 101, 103 and a strained second semiconductor layer 102', 104' is formed on a substrate 100, as shown in FIG. 12. In some embodiments, the layer stack is formed on a buried oxide substrate, including a buried oxide layer 170 and an overlying semiconductor layer 175. In some embodiments, the substrate is a silicon-on-insulator (SOI) substrate.

In some embodiments, the relaxed first semiconductor layers 101, 103 are formed of $Si_xGe_{1-x}$ where $0.1 \leq x \leq 0.9$. In a certain embodiment, the relaxed first semiconductor layers 101, 103 are formed of $Si_xGe_{1-x}$ where $0.5 \leq x \leq 0.7$, for example x=0.6. In some embodiments, the strained second semiconductor layers 102', 104' are formed of $Si_yGe_{1-y}$ where $0 \leq y \leq 0.1$, for example Ge. In some embodiments, the lattice constant of the strained second semiconductor layers 102', 104' is greater than the lattice constant of the relaxed first semiconductor layers 101, 103.

Figure 13:
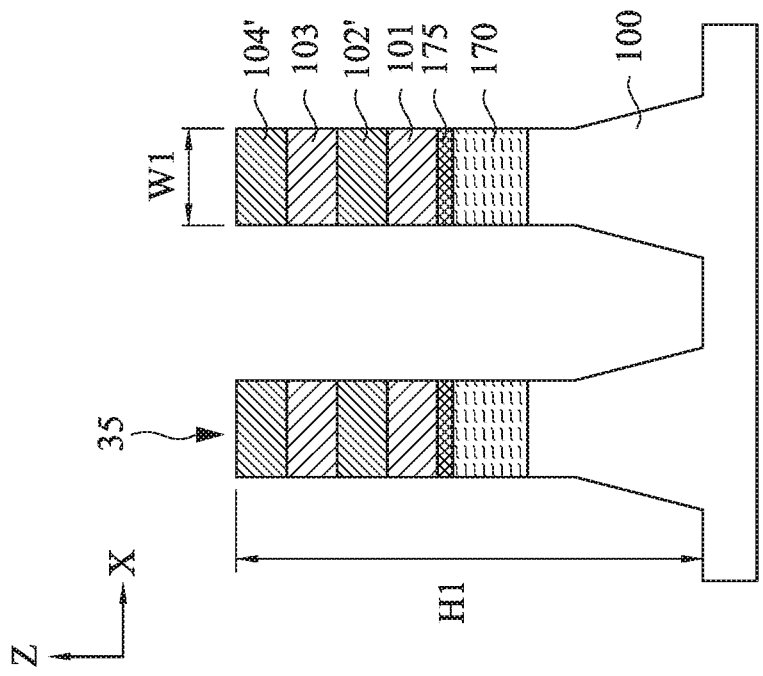
FIG. 13 shows a cross sectional view of one of the various stages of manufacturing a semiconductor FET device according to embodiments of the present disclosure.

Using suitable photolithographic and etching techniques, the layer stack of FIG. 12 is patterned to form a plurality of fins 35, as shown in FIG. 13, cross sectional view taken along line A-A of FIG. 1. In FIG. 13, two fin structures 35 are arranged in the X direction. But the number of the fin structures is not limited to two, and may be as small as one and three or more. In some embodiments, one or more dummy fin structures are formed on both sides of the fin structures 35 to improve pattern fidelity in the patterning operations. As shown in FIG. 13, the fin structures 35 have upper portions constituted by the stacked semiconductor layers 101, 102', 103, 104' and lower well portions 10, 170, 175.

The width W1 of the upper portion of the fin structure 35 along the X direction is in a range from about 5 nm to about 40 nm in some embodiments, and is in a range from about 10 nm to about 30 nm in other embodiments. The height H1 along the Z direction of the fin structure is in a range from about 100 nm to about 200 nm in some embodiments.

The stacked fin structure 35 for a gate all around (GAA) transistor structure may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 35.

After the fin structures 35 are formed, an insulating material layer (not shown) including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that semiconductor layers are exposed from the insulating material layer. In some embodiments, a fin liner layer (not shown) is formed over the fin structures before forming the insulating material layer. The fin liner layer is made of $Si_3N_4$ or a silicon nitride-based material (e.g., SiON, SiCN, or SiOCN).

In some embodiments, the fin liner layers include a first fin liner layer formed over the substrate 100 and sidewalls of the bottom part of the fin structures 35, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Then, the insulating material layer is recessed to form an isolation insulating layer so that the upper portions of the fin structures 35 including the semiconductor layers are exposed. With this operation, the fin structures 35 are electrically separated from each other by the isolation insulating layer, which is also called a shallow trench isolation (STI).

Figure 14:
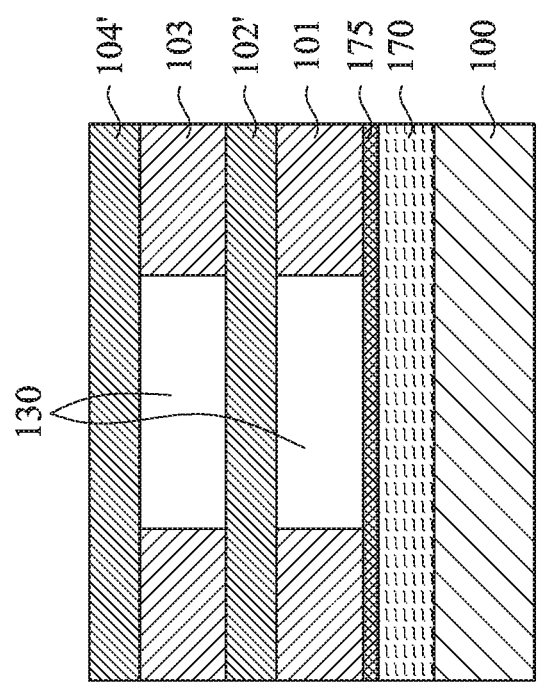
FIG. 14 shows a cross sectional view of one of the various stages of manufacturing a semiconductor FET device according to embodiments of the present disclosure.

Next, the channel portions of the first semiconductor layers are selectively removed to create openings 130, as shown in FIG. 14, thereby creating nanowires of the second semiconductor layers 102', 104' in the channel region with a compressive strain, suitable for pFETs.

Figure 15:
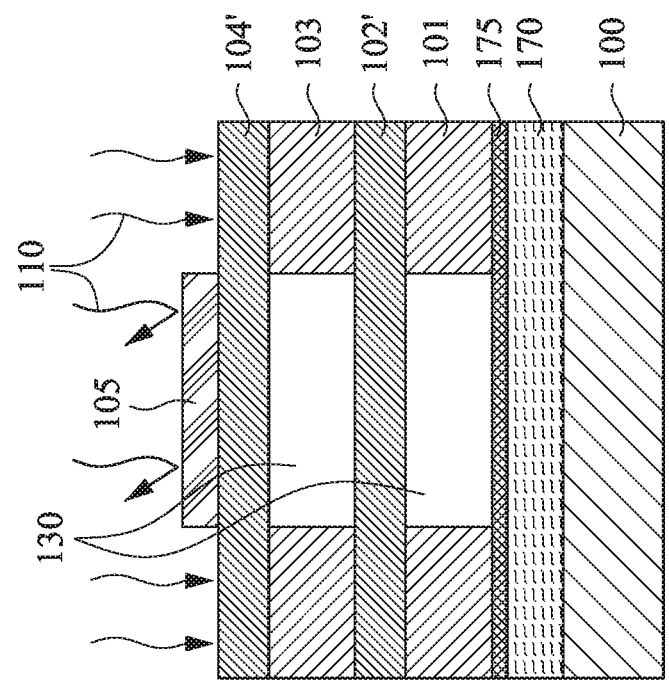
FIG. 15 shows a cross sectional view of one of the various stages of manufacturing a semiconductor FET device according to embodiments of the present disclosure.

A mask layer 105 is subsequently formed over the channel regions of the second semiconductor layers 102', 104', as shown in FIG. 15. The mask layer is made of a reflective material, such as a metal, in some embodiments. In some embodiments, the metal for the mask is selected from the group consisting of aluminum, nickel, gold, platinum, chromium, copper, zinc, and zirconium. The mask layer material may be deposited by CVD, atomic layer deposition (ALD), physical vapor deposition (PVD), electroplating, or other suitable methods. After depositing the mask layer material, the mask layer 105 is formed by suitable photolithographic and etching techniques in some embodiments.

The layer stack is subsequently selectively irradiated with radiation 110 from a radiation source, as shown in FIG. 15. In some embodiments, the radiation source is a laser or a flash lamp, including argon and xenon flash lamps. The layer stack is exposed to the radiation 110 according to any of the conditions previously discussed herein with reference to FIG. 6.

Figure 16:
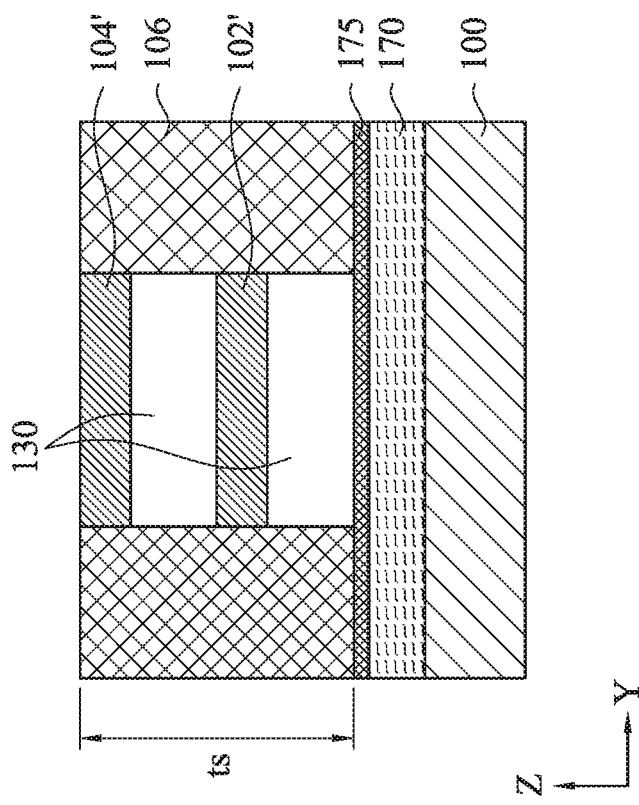
FIG. 16 shows a cross sectional view of one of the various stages of manufacturing a semiconductor FET device according to embodiments of the present disclosure.

The radiation 110 anneals the source/drain regions of the fin structure causing the first semiconductor layers 101, 103 and the second semiconductor layers 102', 104' to combine and form a source/drain stressor region 106, as shown in FIG. 16. The source/drain stressor region 106 is formed in a similar manner as previously discussed herein with reference to FIG. 7.

In some embodiments, the source/drain regions are doped with an appropriate dopant prior to annealing. In such embodiments, the annealing additionally activates the dopants in the source/drain regions. In certain embodiments, the source/drain regions are doped with up to $2\times10^{20}$ dopants/cm$^3$. The dopants can be n-type or p-type dopants, including one or more of As, Sb, P, B, Ga, and Al. In some embodiments, in-situ doping is used to incorporate the dopant. In other embodiments, ion-implantation, plasma-doping, solid-phase doping, or other doping techniques are used.

Figure 17:
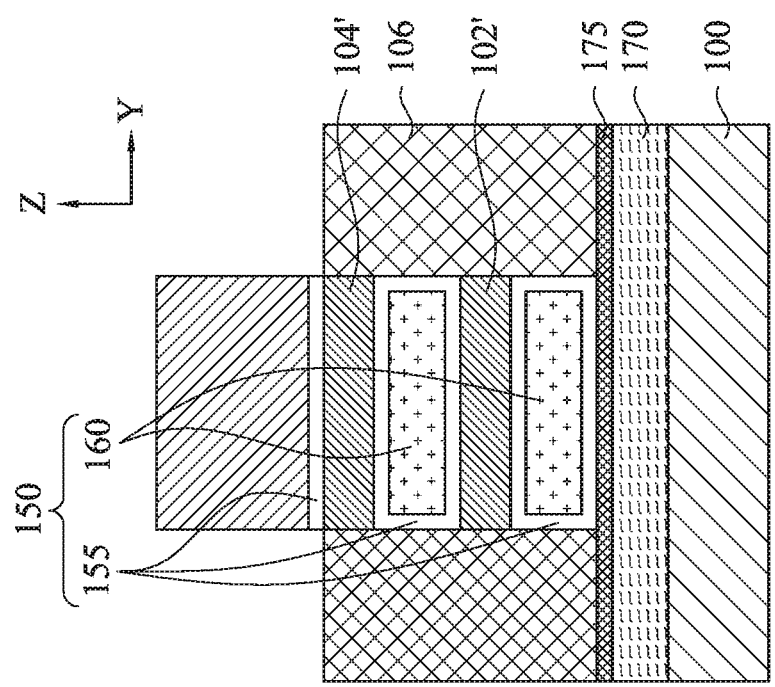
FIG. 17 shows a cross sectional view of one of the various stages of manufacturing a semiconductor FET device according to embodiments of the present disclosure.

After the irradiation, the mask layer 105 is removed using a suitable etching technique, as shown in FIG. 16, and additional processing is performed. Additional processing includes forming a gate electrode structure 150 wrapping around the nanowires 102', 104' in the channel region to form a gate all around field effect transistor (GAA FET), as shown in FIG. 17. The gate electrode structure 150 includes a gate dielectric layer 155 wrapping around the nanowires 102, 104 and a gate electrode layer 160 disposed on the gate dielectric layer wrapping around the nanowires. In some embodiments, an interfacial layer and work function adjustment layers are formed between the gate dielectric layer 155 and the gate electrode layer 160.

In certain embodiments, the gate dielectric layer 155 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof.

The gate dielectric layer 155 may be formed by CVD, ALD, or any suitable method. In one embodiment, the gate dielectric layer 155 is formed using a highly conformal deposition process such as ALD in order to ensure the formation of a gate dielectric layer having a uniform thickness around each channel layers. The thickness of the gate dielectric layer 155 is in a range from about 1 nm to about 6 nm in some embodiments.

The gate electrode layer 160 is formed on the gate dielectric layer 155 to surround each channel layer. The gate electrode layer 160 includes one or more layers of conductive material, such as polysilicon; or a metal, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 160 may be formed by CVD, ALD, electroplating, or other suitable methods.

In certain embodiments of the present disclosure, one or more work function adjustment layers (not shown) are interposed between the gate dielectric layer 155 and the gate electrode layer 160, as previously discussed herein.

The annealing of the source/drain regions of the device in FIG. 15 to produce source/drain stressor regions 106 according to embodiments of the present disclosure provides a tensile strain in the channel region, thereby providing devices with a tensile strain that are suitable for nFETs. Thus, by forming a plurality of devices on a substrate where some of the devices are selectively annealed and other devices on the substrate are not radiation annealed, both nFETs and pFETs can be formed on the substrate according to embodiments of the present disclosure. Thus, the present disclosure provides an improved method for fabricating complementary metal oxide semiconductor field effect transistors (CMOSFET or CMOS devices).

Figure 18:
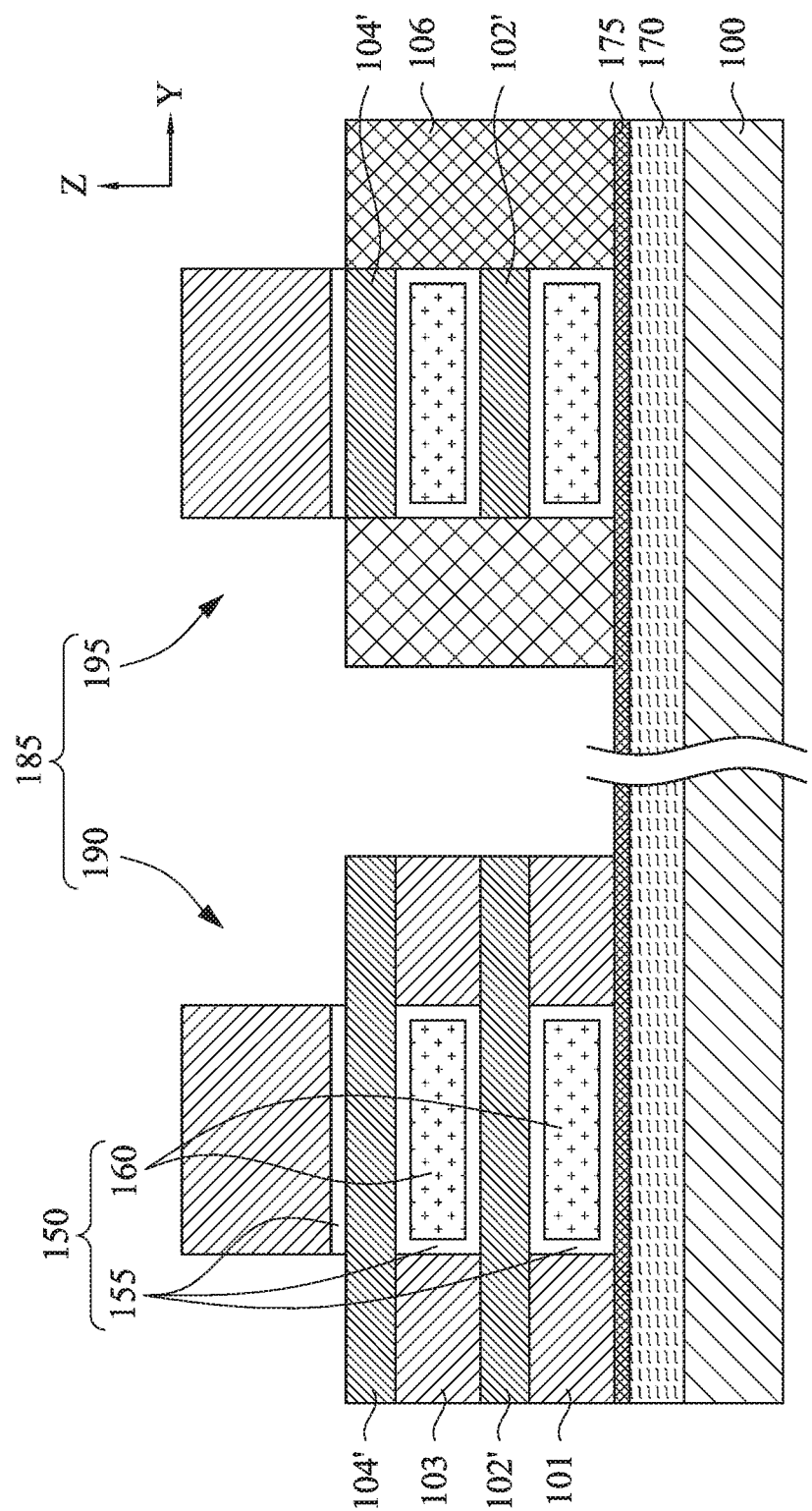
FIG. 18 shows a cross sectional view of a semiconductor FET device according to embodiments of the present disclosure.

An example of a CMOS device 185 according to the present disclosure is illustrated in FIG. 18. As shown in FIG. 18, a pFET 190 having second semiconductor wires 102', 104' under compressive strain are formed by forming a gate electrode structure 150 in the channel region of the structure of FIG. 14. An nFET 195 is formed by the device of FIG. 17. Both pFET 190 and nFET 195 are formed on a common substrate 100. In some embodiments, the substrate is an SOI substrate including a silicon layer 175 and buried oxide layer 170 formed on the substrate 100.

Figure 19:
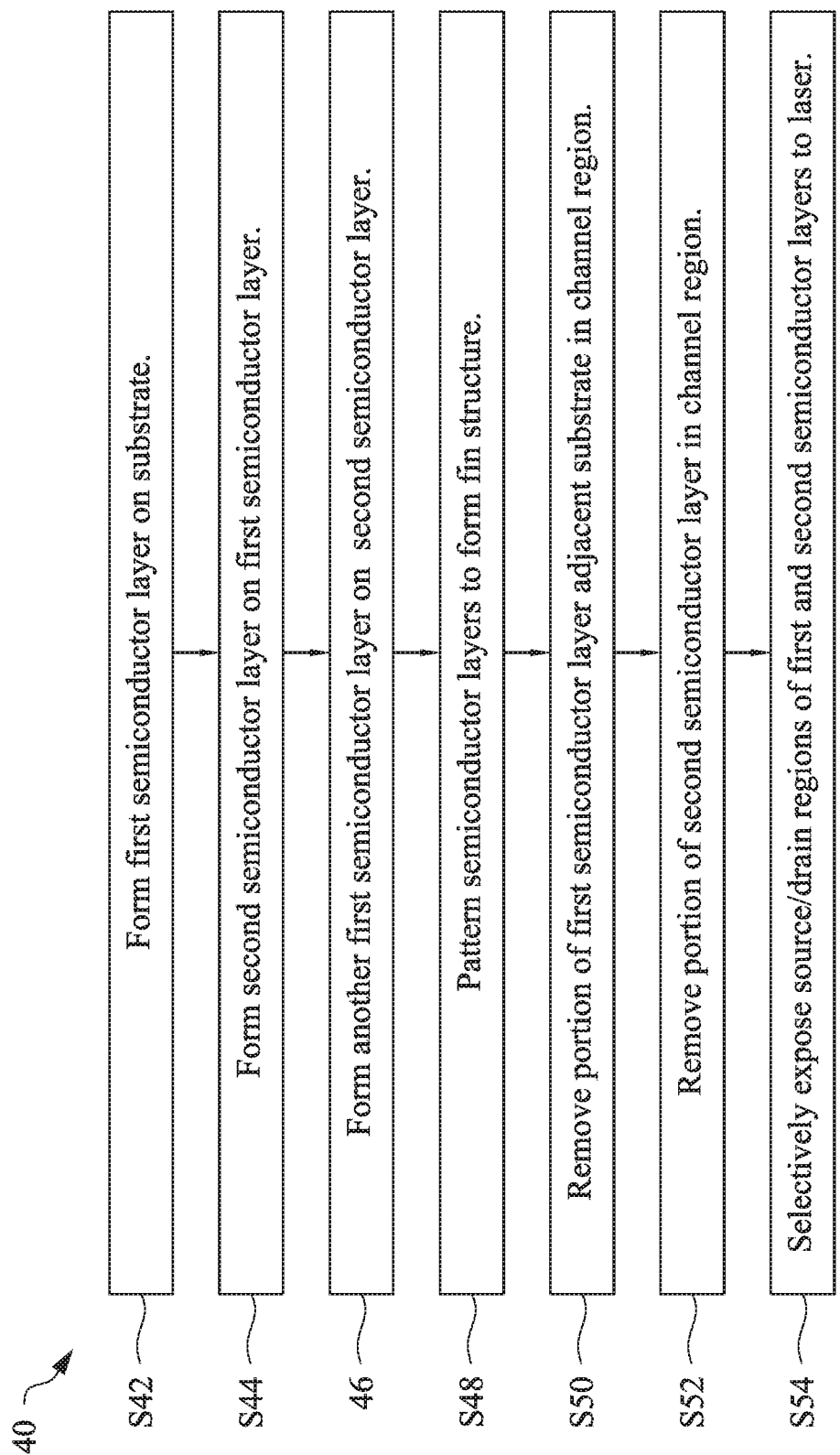
FIG. 19 is a flowchart of a method of manufacturing a semiconductor device according to an embodiment of the present disclosure.

FIG. 19 is a flowchart of another method 40 of manufacturing a semiconductor device according to an embodiment of the present disclosure. A first semiconductor layer is formed on a substrate in operation S42, and a second semiconductor layer is formed on the first semiconductor layer in operation S44. In operation S46, another first semiconductor layer is formed on the second semiconductor layer. The first and second semiconductor layers are formed of different materials. Next, the semiconductor layers are patterned to form a fin structure in operation S48. The fin structure includes a channel region and source/drain regions on each side of the channel regions. A portion of the first semiconductor layer adjacent the substrate is subsequently removed in the channel region in operation S50. Then a portion of the second semiconductor layer is removed in the channel region in operation S52. Next, the source/drain regions of the first and second semiconductor layers are selectively exposed to laser radiation in operation S54.

Figure 20:
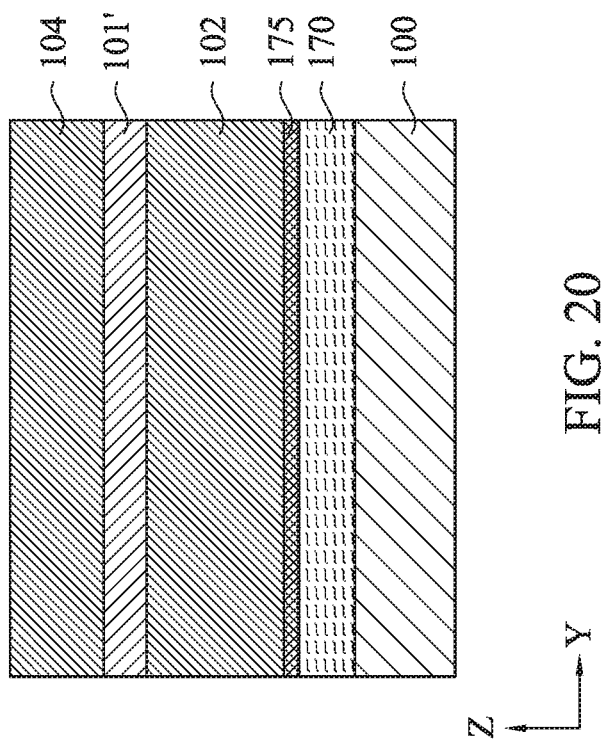
FIG. 20 shows a cross sectional view of one of the various stages of manufacturing a semiconductor FET device according to embodiments of the present disclosure.

FIGS. 20-25 show exemplary sequential processes for manufacturing a GAA FET according to embodiments of the present disclosure, including the method shown in the flowchart of FIG. 19. A fin structure having a layer stack of a relaxed second semiconductor layer 102, a strained first semiconductor layer 101', and another relaxed second semiconductor layer 104 is formed on a substrate 100, is shown in FIG. 20. In some embodiments, a plurality of alternating second semiconductor layer 102, first semiconductor layer 101', and another second semiconductor layer 104 are provided on a substrate. In some embodiments, the layer stack is formed on a buried oxide substrate, including a buried oxide layer 170 and an overlying semiconductor layer 175. In some embodiments, the substrate is a silicon-on-insulator (SOI) substrate. In some embodiments, the overlying semiconductor layer 175 is a p-doped silicon layer.

In some embodiments, the strained first semiconductor layer 101' is formed of $Si_xGe_{1-x}$ where $0.1 \leq x \leq 0.9$. In a certain embodiment, the strained first semiconductor layer 101' is formed of $Si_xGe_{1-x}$ where $0.5 \leq x \leq 0.7$, for example x=0.6. In some embodiments, the relaxed second semiconductor layers 102, 104 are formed of $Si_yGe_{1-y}$ where 0≤y≤0.1, for example Ge. In some embodiments, the lattice constant of the relaxed second semiconductor layers 102, 104 is greater than the lattice constant of the strained first semiconductor layer 101'. In some embodiments the second semiconductor layer 102 adjacent the substrate is thicker than the first semiconductor layer 101' and thicker than the second semiconductor layer 104 further away from the substrate. In some embodiments, the second semiconductor layer 104 further away from the substrate is thicker than the first semiconductor layer 101'.

Using suitable photolithographic and etching techniques, the layer stack of FIG. 20 is patterned to form a plurality of fins. The patterning of the layer stack of FIG. 20 is performed in the same manner as previously discussed herein in reference to FIG. 13 in some embodiments. In addition, STI regions are formed in some embodiments as previously discussed herein.

Figure 21:
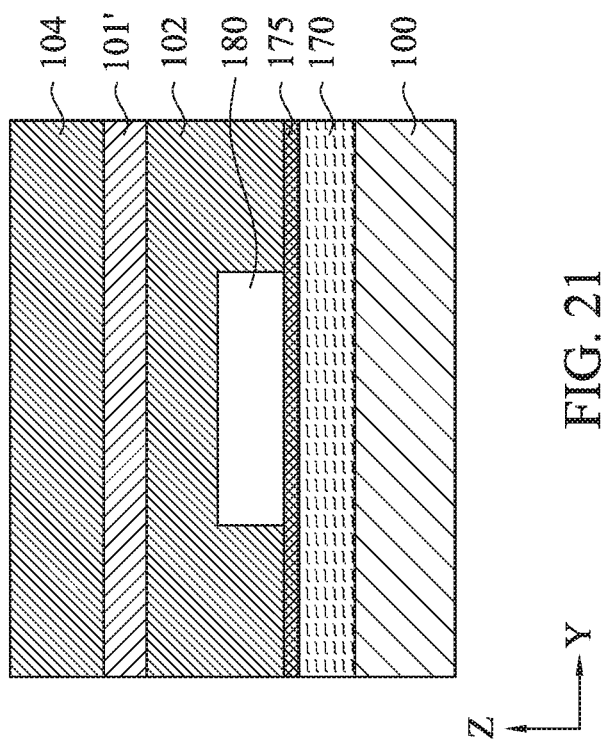
FIG. 21 shows a cross sectional view of one of the various stages of manufacturing a semiconductor FET device according to embodiments of the present disclosure.

Next, a portion of the channel portion of the second semiconductor layer 102 adjacent the substrate 100 is selectively removed to create opening 180, as shown in FIG. 21. The second semiconductor layer 102 adjacent the substrate is not entirely removed in the channel region in this embodiment. A portion of the thickness of the second semiconductor layer 102 adjacent the first semiconductor layer 101' in the channel region remains. In some embodiments, about 25% to about 75% of the second semiconductor layer 102 adjacent the substrate remains in the channel region. The lower portion of the second semiconductor layer 102 can be selectively removed because of defects in the lower portion of the second semiconductor layer 102 adjacent the substrate caused by misfit dislocations at the interface between the overlying semiconductor layer 175 and the second semiconductor layer 102 adjacent the substrate. Therefore, the etching rate of the lower portion of the second semiconductor layer 102 adjacent the substrate is much faster than the upper portion of the second semiconductor layer 102 adjacent the substrate and the second semiconductor layer 104 further away from the substrate. When forming the opening 180 in the lower portion of the second semiconductor layer adjacent the substrate, the upper portion of the second semiconductor layer 102 adjacent the substrate and the second semiconductor layer 104 further away from the substrate will be thinned by the etching process in some embodiments. In some embodiments, the portion of the second semiconductor layer 102 adjacent the substrate is removed by suitable selective etching and masking techniques. In some examples, the etching is performed using a plasma formed from HBr and $Cl_2$.

Figure 22:
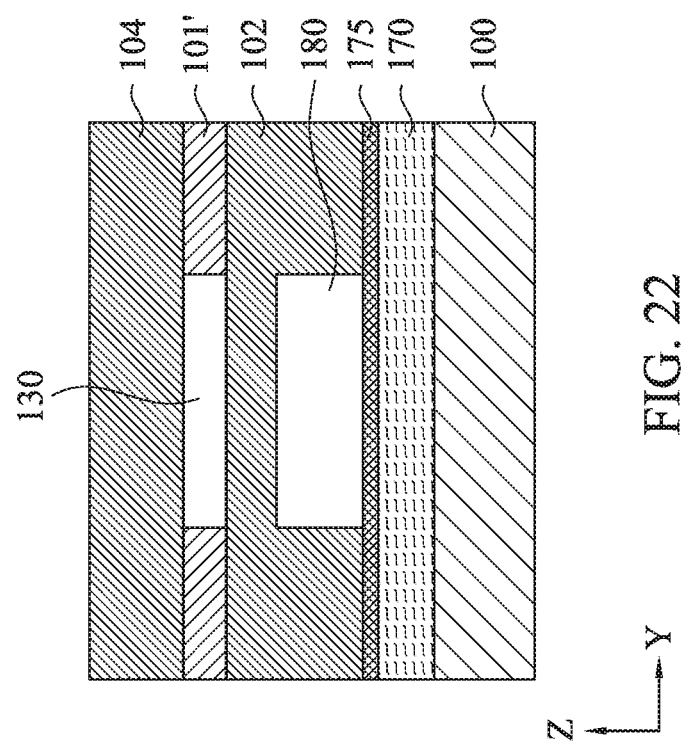
FIG. 22 shows a cross sectional view of one of the various stages of manufacturing a semiconductor FET device according to embodiments of the present disclosure.

Next, the channel portion of the strained first semiconductor layer 101' is selectively removed to create openings 130, as shown in FIG. 22, thereby creating nanowires of the second semiconductor layers 102, 104 in the channel region with a tensile strain, suitable for nFETs.

Figure 23:
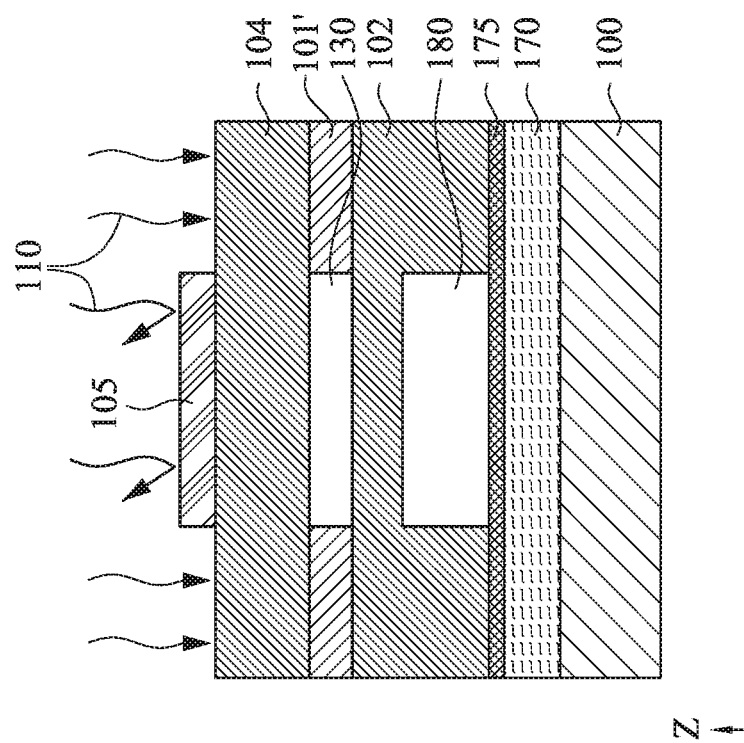
FIG. 23 shows a cross sectional view of one of the various stages of manufacturing a semiconductor FET device according to embodiments of the present disclosure.

A mask layer 105 is subsequently formed over the channel region of the second semiconductor layers 102, 104, as shown in FIG. 23. The mask layer is made of a reflective material, such as a metal, in some embodiments. In some embodiments, the metal for the mask is selected from the group consisting of aluminum, nickel, gold, platinum, chromium, copper, zinc, and zirconium. The mask layer material may be deposited by CVD, atomic layer deposition (ALD), physical vapor deposition (PVD), electroplating, or other suitable methods, After depositing the mask layer material, the mask layer 105 is formed by suitable photolithographic and etching techniques in some embodiments.

The layer stack is subsequently selectively irradiated with radiation 110 from a radiation source, as shown in FIG. 23.

In some embodiments, the radiation source is a laser or a flash lamp, including argon and xenon flash lamps. The layer stack is exposed to the radiation 110 according to any of the conditions previously discussed herein with reference to FIG. 6.

Figure 24:
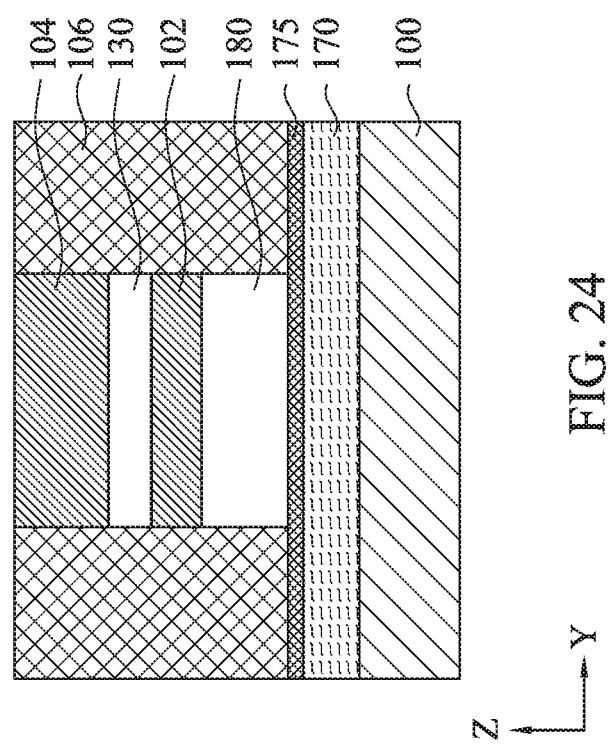
FIG. 24 shows a cross sectional view of one of the various stages of manufacturing a semiconductor FET device according to embodiments of the present disclosure.

The radiation 110 anneals the source/drain regions of the fin structure causing the second semiconductor layers 102, 104 and the first semiconductor layer 101' to combine and form a source/drain stressor region 106, as shown in FIG. 24. The source/drain stressor region 106 is formed in a similar manner as previously discussed herein with reference to FIG. 7.

In some embodiments, the source/drain regions are doped with an appropriate dopant prior to annealing. In such embodiments, the annealing additionally activates the dopants in the source/drain regions. In certain embodiments, the source/drain regions are doped with up to $2 \times 10^{20}$ dopants/$cm^3$. The dopants can be n-type or p-type dopants, including one or more of As, Sb, P, B, Ga, and Al. In some embodiments, in-situ doping is used to incorporate the dopant. In other embodiments, ion-implantation, plasma-doping, solid-phase doping, or other doping techniques are used.

Figure 25:
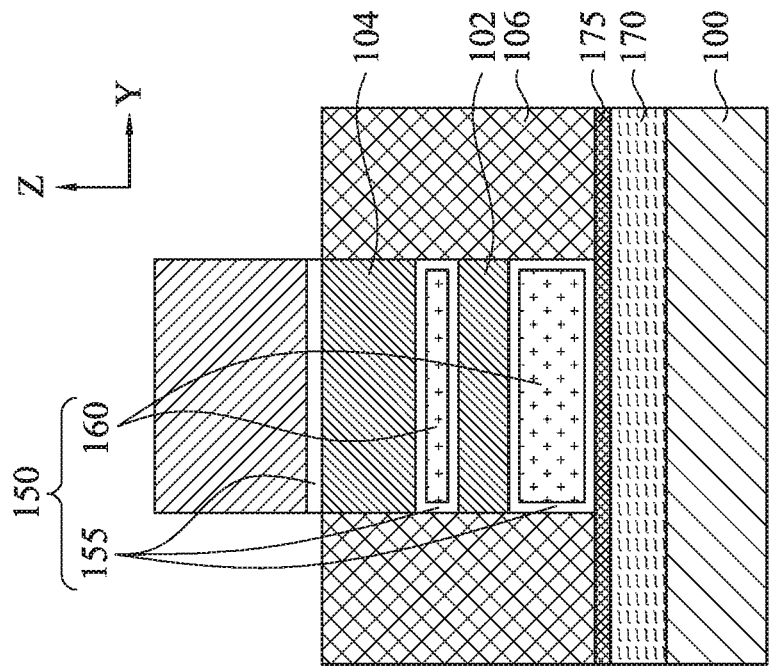
FIG. 25 shows a cross sectional view of one of the various stages of manufacturing a semiconductor FET device according to embodiments of the present disclosure.

After the irradiation, the mask layer 105 is removed using a suitable etching technique, as shown in FIG. 24, and additional processing is performed. Additional processing includes forming a gate electrode structure 150 wrapping around the nanowires 102, 104 in the channel region to form a gate all around field effect transistor (GAA FET), as shown in FIG. 25. The gate electrode structure 150 includes a gate dielectric layer 155 wrapping around the nanowires 102, 104 and a gate electrode layer 160 disposed on the gate dielectric layer wrapping around the nanowires. In some embodiments, an interfacial layer and work function adjustment layers are formed between the gate dielectric layer 155 and the gate electrode layer 160.

In certain embodiments, the gate dielectric layer 155 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 155 may be formed by CVD, ALD, or any suitable method. In one embodiment, the gate dielectric layer 155 is formed using a highly conformal deposition process such as ALD in order to ensure the formation of a gate dielectric layer having a uniform thickness around each channel layers. The thickness of the gate dielectric layer 155 is in a range from about 1 nm to about 6 nm in some embodiments.

The gate electrode layer 160 is formed on the gate dielectric layer 155 to surround each channel layer. The gate electrode layer 160 includes one or more layers of conductive material, such as polysilicon; or a metal, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 160 may be formed by CVD, ALD, electroplating, or other suitable methods.

In certain embodiments of the present disclosure, one or more work function adjustment layers (not shown) are interposed between the gate dielectric layer 155 and the gate electrode layer 160, as previously discussed herein.

The annealing of the source/drain regions of the device in FIG. 24 to produce source/drain stressor regions 106 according to embodiments of the present disclosure provides a tensile strain in the channel region, thereby providing devices with a tensile strain that are suitable for nFETs. Thus, by forming a plurality of devices on a substrate where some of the devices are selectively annealed and other devices on the substrate are not radiation annealed, both nFETs and pFETs can be formed on the substrate according to embodiments of the present disclosure. Thus, the present disclosure provides an improved method for fabricating CMOS devices.

Figure 26:
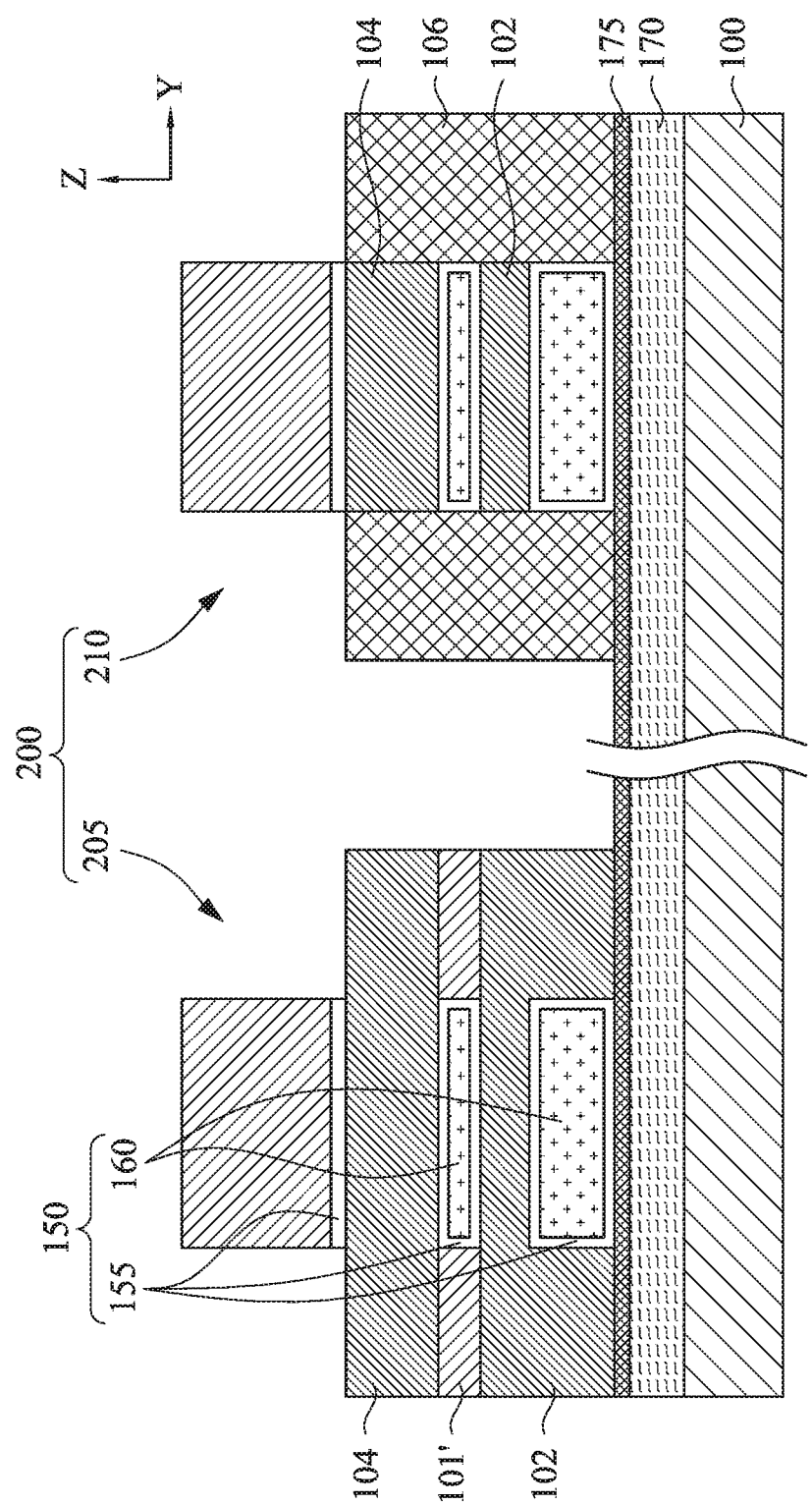
FIG. 26 shows a cross sectional view of a semiconductor FET device according to embodiments of the present disclosure.

An example of a CMOS device 200 according to the present disclosure is illustrated in FIG. 26. As shown in FIG. 26, an nFET 205 having second semiconductor layer wires 102, 104 under tensile strain are formed by forming a gate electrode structure 150 in the channel region of the structure of FIG. 22. A pFET 210 is formed by the device of FIG. 25. Both pFET 210 and nFET 205 are formed on a common substrate 100. In some embodiments, an nFET can be formed by the device of FIG. 25 without annealing the source/drain regions. In some embodiments, the substrate is an SOI substrate including a silicon layer 175 and buried oxide layer 170 formed on the substrate 100.

Figure 27:
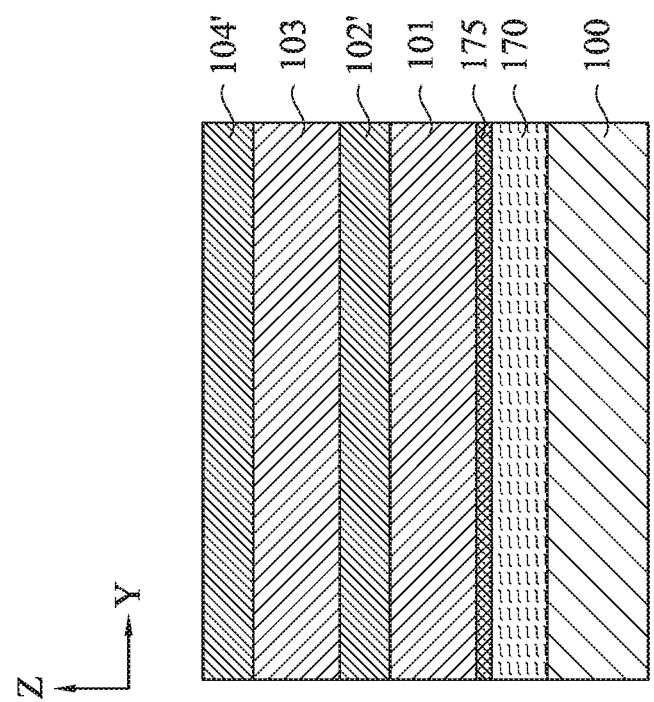
FIG. 27 shows a cross sectional view of one of the various stages of manufacturing a semiconductor FET device according to embodiments of the present disclosure.

FIGS. 27-31 show exemplary sequential processes for manufacturing a GAA FET according to embodiments of the present disclosure. A fin structure having a layer stack of a relaxed first semiconductor layer 101, a strained second semiconductor layer 102', another relaxed first semiconductor layer 103, and another strained second semiconductor layer 104', is formed on a substrate 100, is shown in FIG. 27. In some embodiments, a plurality of alternating first semiconductor layers 101, 103 and second semiconductor layers 102', 104 are provided on a substrate. In some embodiments, the layer stack is formed on a buried oxide substrate, including a buried oxide layer 170 and an overlying semiconductor layer 175. In some embodiments, the substrate is a silicon-on-insulator (SOI) substrate.

In some embodiments, the relaxed first semiconductor layers 101, 103 are formed of $Si_xGe_{1-x}$ where $0.1 \leq x \leq 0.9$. In a certain embodiment, the relaxed first semiconductor layers 101, 103 are formed of $Si_xGe_{1-x}$ where $0.5 \leq x \leq 0.7$, for example x=0.6. In some embodiments, the strained second semiconductor layers 102', 104' are formed of $Si_yGe_{1-y}$ where $0.9 \leq y \leq 1$, for example Si. In some embodiments, the lattice constant of the relaxed first semiconductor layers 101, 103 is greater than the lattice constant of the strained second semiconductor layer 102', 104'. In some embodiments the first semiconductor layer 101 adjacent the substrate is thicker than the second semiconductor layers 102', 104' and thicker than the first semiconductor layer 103 further away from the substrate. In some embodiments, the second semiconductor layer 102', 104' are thicker than the first semiconductor layer 103 further away from the substrate.

Using suitable photolithographic and etching techniques, the layer stack of FIG. 27 is patterned to form a plurality of fins. The patterning of the layer stack of FIG. 27 is performed in the same manner as previously discussed herein in reference to FIG. 13 in some embodiments. In addition, STI regions are formed in some embodiments as previously discussed herein.

Figure 28:
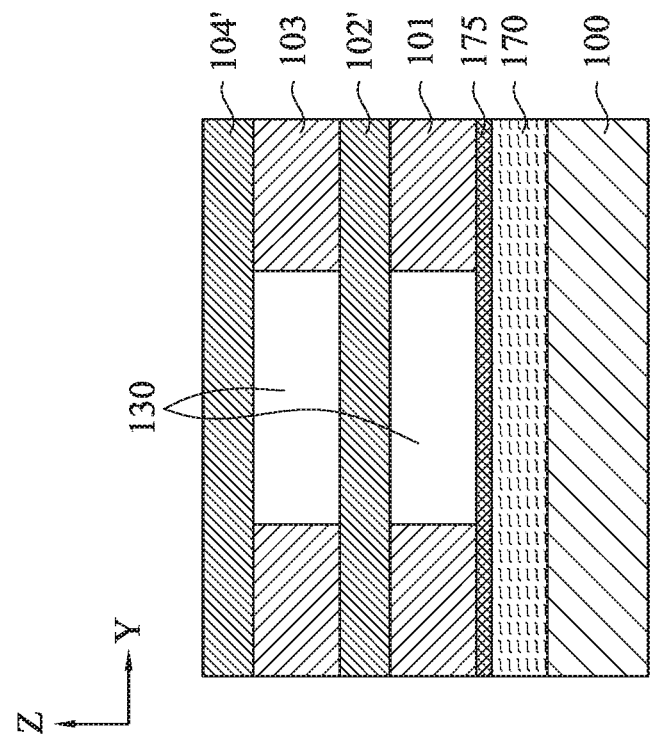
FIG. 28 shows a cross sectional view of one of the various stages of manufacturing a semiconductor FET device according to embodiments of the present disclosure.

Next, the channel portion of the first semiconductor layers 101, 103 are selectively removed to create openings 130, as shown in FIG. 28. The channel portion of first semiconductor layers 101, 103 is removed by suitable selective etching and masking techniques. The selective etching is performed using appropriate masking and a $Cl_2$/HBr plasma etchant in some embodiments. Selectively removing the channel portions of the first semiconductor layers (SiGe layers), as shown in FIG. 28, creates nanowires in the channel region with a tensile strain, suitable for nFETs.

Figure 29:
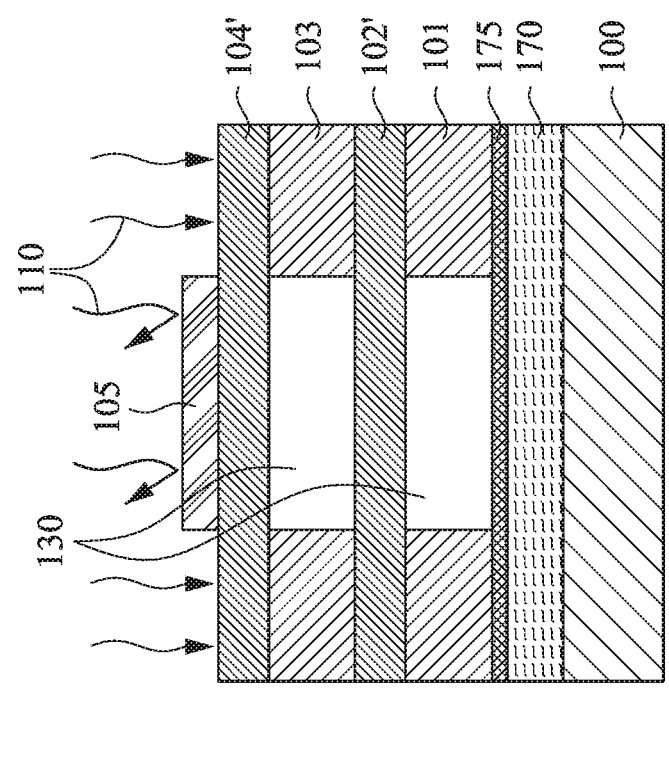
FIG. 29 shows a cross sectional view of one of the various stages of manufacturing a semiconductor FET device according to embodiments of the present disclosure.

A mask layer 105 is subsequently formed over the channel regions of the second semiconductor layers 102', 104', as shown in FIG. 29. The mask layer is made of a reflective material, such as a metal, in some embodiments. In some embodiments, the metal for the mask is selected from the group consisting of aluminum, nickel, gold, platinum, chromium, copper, zinc, and zirconium. The mask layer material may be deposited by CVD, atomic layer deposition (ALD), physical vapor deposition (PVD), electroplating, or other suitable methods, After depositing the mask layer material, the mask layer 105 is formed by suitable photolithographic and etching techniques in some embodiments.

The layer stack is subsequently selectively irradiated with radiation 110 from a radiation source, as shown in FIG. 29. In some embodiments, the radiation source is a laser or a flash lamp, including argon and xenon flash lamps. The layer stack is exposed to the radiation 110 according to any of the conditions previously discussed herein with reference to FIG. 6.

Figure 30:
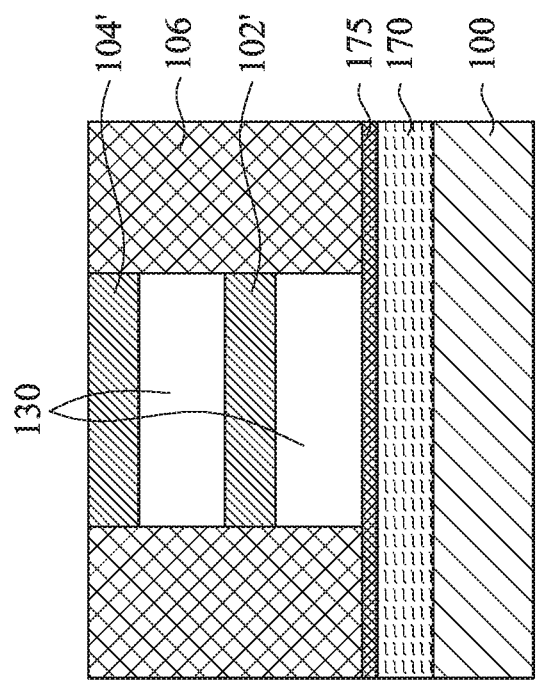
FIG. 30 shows a cross sectional view of one of the various stages of manufacturing a semiconductor FET device according to embodiments of the present disclosure.

The radiation 110 anneals the source/drain regions of the fin structure causing the first semiconductor layers 101, 103 and the second semiconductor layers 102', 104' to combine and form a source/drain stressor region 106, as shown in FIG. 30. The source/drain stressor region 106 is formed in a similar manner as previously discussed herein with reference to FIG. 7.

In some embodiments, the source/drain regions are doped with an appropriate dopant prior to annealing. In such embodiments, the annealing additionally activates the dopants in the source/drain regions. In certain embodiments, the source/drain regions are doped with up to $2 \times 10^{20}$ dopants/$cm^3$. The dopants can be n-type or p-type dopants, including one or more of As, Sb, P, B, Ga, and Al. In some embodiments, in-situ doping is used to incorporate the dopant. In other embodiments, ion-implantation, plasma-doping, solid-phase doping, or other doping techniques are used.

Figure 31:
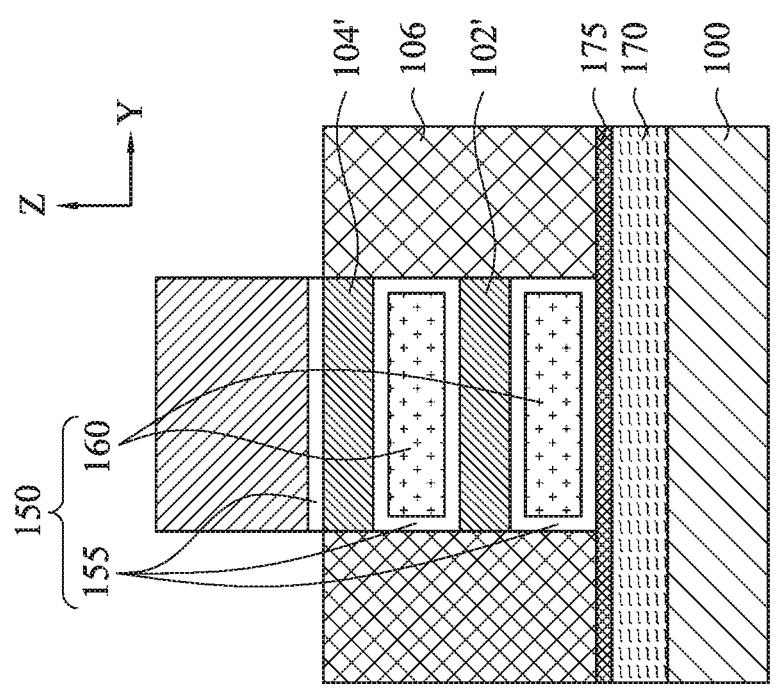
FIG. 31 shows a cross sectional view of one of the various stages of manufacturing a semiconductor FET device according to embodiments of the present disclosure.

After the irradiation, the mask layer 105 is removed using a suitable etching technique, as shown in FIG. 30, and additional processing is performed. Additional processing includes forming a gate electrode structure 150 wrapping around the nanowires 102', 104' in the channel region to form a gate all around field effect transistor (GAA FET), as shown in FIG. 31. The gate electrode structure 150 includes a gate dielectric layer 155 wrapping around the nanowires 102', 104' and a gate electrode layer 160 disposed on the gate dielectric layer wrapping around the nanowires. In some embodiments, an interfacial layer and work function adjustment layers are formed between the gate dielectric layer 155 and the gate electrode layer 160.

In certain embodiments, the gate dielectric layer 155 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 155 may be formed by CVD, ALD, or any suitable method. In one embodiment, the gate dielectric layer 155 is formed using a highly conformal deposition process such as ALD in order to ensure the formation of a gate dielectric layer having a uniform thickness around each channel layers. The thickness of the gate dielectric layer 155 is in a range from about 1 nm to about 6 nm in some embodiments.

The gate electrode layer 160 is formed on the gate dielectric layer 155 to surround each channel layer. The gate electrode layer 160 includes one or more layers of conductive material, such as polysilicon; or a metal, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 160 may be formed by CVD, ALD, electroplating, or other suitable methods.

In certain embodiments of the present disclosure, one or more work function adjustment layers (not shown) are interposed between the gate dielectric layer 155 and the gate electrode layer 160, as previously discussed herein.

The annealing of the source/drain regions of the device in FIG. 29 to produce source/drain stressor regions 106 according to embodiments of the present disclosure provides a compressive strain in the channel region, thereby providing devices with a compressive strain that are suitable for pFETs. Thus, by forming a plurality of devices on a substrate where some of the devices are selectively annealed and other devices on the substrate are not radiation annealed, both nFETs and pFETs can be formed on the substrate according to embodiments of the present disclosure. Thus, the present disclosure provides an improved method for fabricating CMOS devices.

Figure 32:
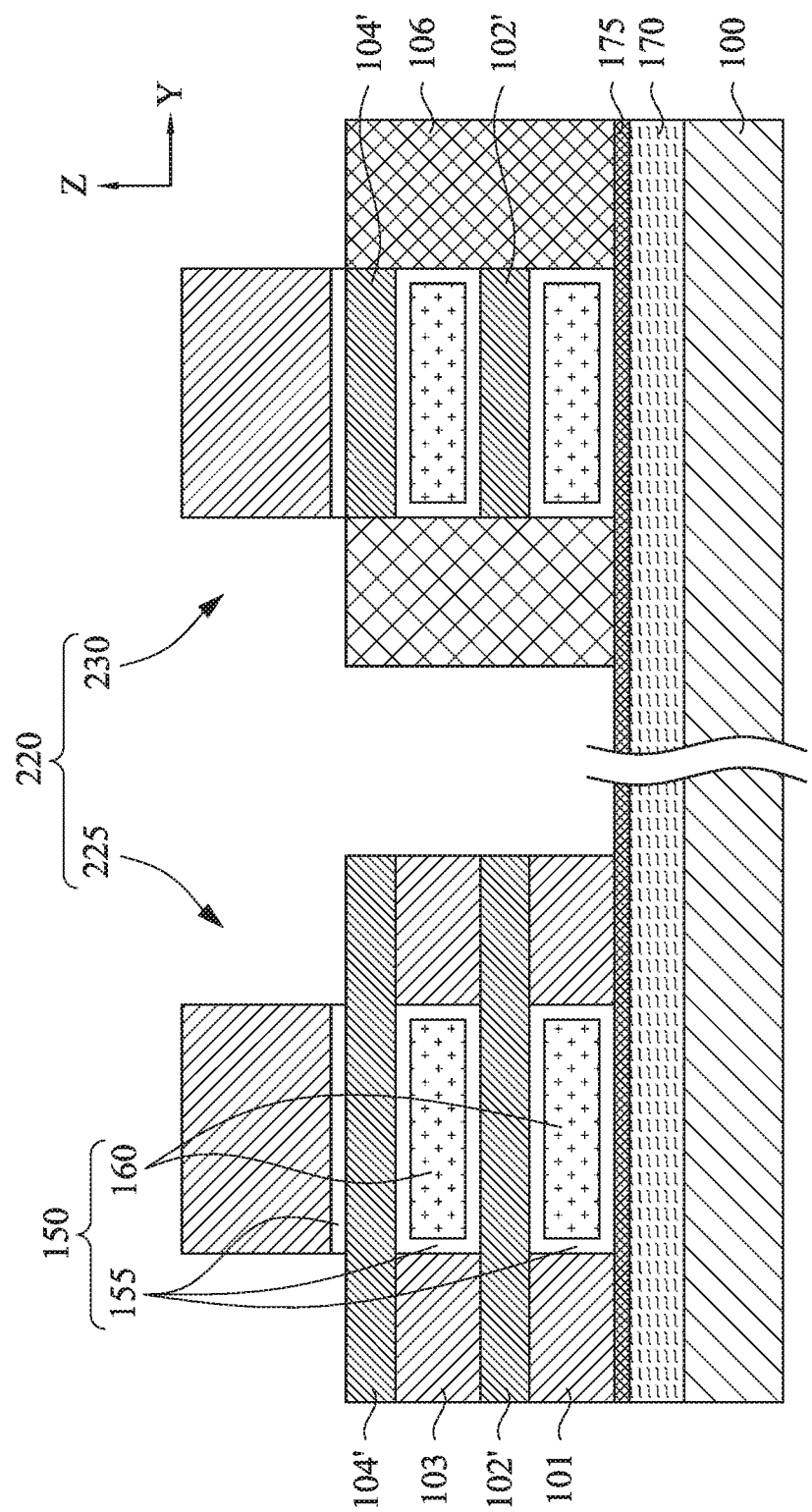
FIG. 32 shows a cross sectional view of a semiconductor FET device according to embodiments of the present disclosure.

An example of a CMOS device 220 according to the present disclosure is illustrated in FIG. 32. As shown in FIG. 32, an nFET 225 having second semiconductor wires 102', 104' under tensile strain are formed by forming a gate electrode structure 150 in the channel region of the structure of FIG. 28. A pFET 230 having second semiconductor wires 102', 104' under compressive strain is formed by the device of FIG. 31. Both pFET 230 and nFET 225 are formed on a common substrate 100. In some embodiments, the substrate is an SOI substrate including a silicon layer 175 and buried oxide layer 170 formed on the substrate 100.

Figure 33:
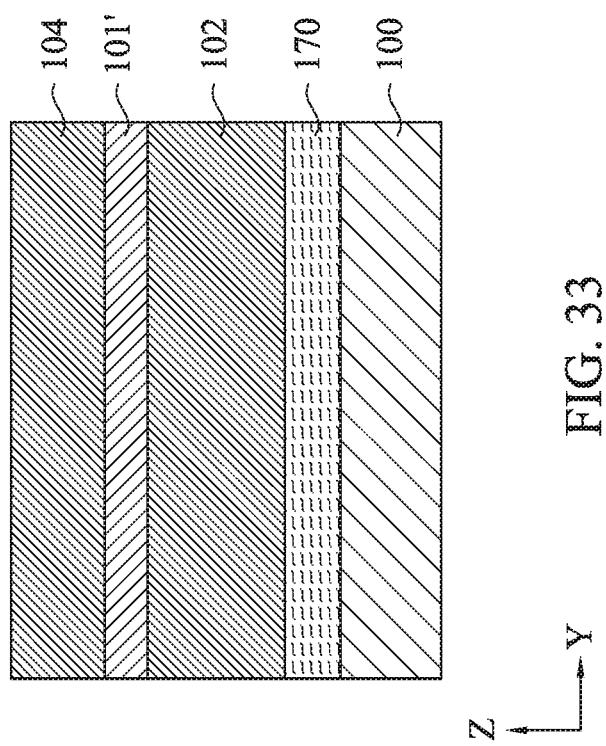
FIG. 33 shows a cross sectional view of one of the various stages of manufacturing a semiconductor FET device according to embodiments of the present disclosure.

FIGS. 33-38 show exemplary sequential processes for manufacturing a GAA FET according to embodiments of the present disclosure. A fin structure having a layer stack of a relaxed second semiconductor layer 102, a strained first semiconductor layer 101', and another relaxed second semiconductor layer 104 is formed on a substrate 100, is shown in FIG. 33. In some embodiments, a plurality of alternating second semiconductor layer 102, first semiconductor layer 101', and another second semiconductor layer 104 are provided on a substrate. In some embodiments, the layer stack is formed on a buried oxide substrate, including a buried oxide layer 170 formed on the substrate.

In some embodiments, the strained first semiconductor layer 101' is formed of $Si_xGe_{1-x}$ where $0.1 \leq x \leq 0.9$. In a certain embodiment, the strained first semiconductor layer 101 is formed of $Si_xGe_{1-x}$ where $0.5 \leq x \leq 0.7$, for example x=0.6. In some embodiments, the relaxed second semiconductor layers 102, 104 are formed of $Si_yGe_{1-y}$ where $0.9 \leq y \leq 1$, for example Si. In some embodiments, the lattice constant of the relaxed second semiconductor layers 102, 104 is smaller than the lattice constant of the strained first semiconductor layer 101'. In some embodiments the second semiconductor layer 102 adjacent the substrate is thicker than the first semiconductor layer 101' and thicker than the second semiconductor layer 104 further away from the substrate. In some embodiments, the second semiconductor layer 104 further away from the substrate is thicker than the first semiconductor layer 101'.

Using suitable photolithographic and etching techniques, the layer stack of FIG. 33 is patterned to form a plurality of fins. The patterning of the layer stack of FIG. 33 is performed in the same manner as previously discussed herein in reference to FIG. 13 in some embodiments. In addition, STI regions are formed in some embodiments as previously discussed herein.

Figure 34:
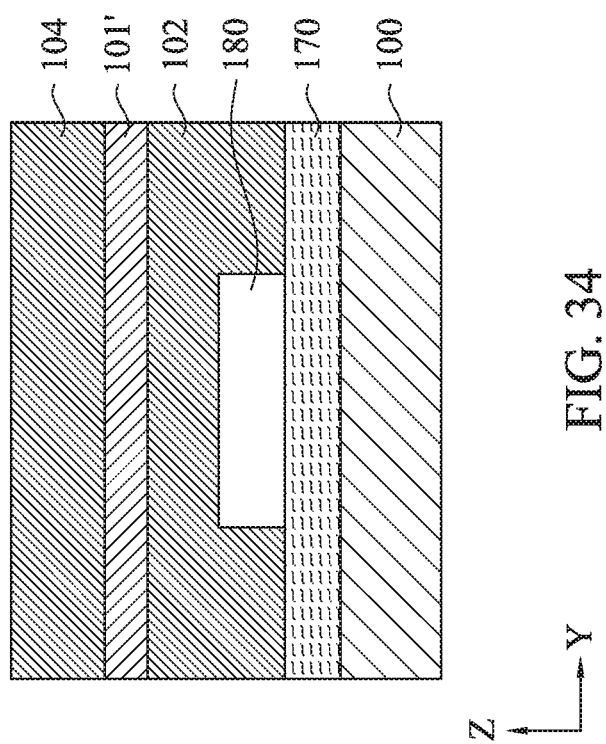
FIG. 34 shows a cross sectional view of one of the various stages of manufacturing a semiconductor FET device according to embodiments of the present disclosure.

Next, a portion of the channel portion of the second semiconductor layer 102 adjacent the substrate 100 is selectively removed to create openings 180, as shown in FIG. 34. The second semiconductor layer 102 adjacent the substrate is not entirely removed in the channel region in this embodiment. A portion of the thickness of the second semiconductor layer 102 adjacent the first semiconductor layer 101' in the channel region remains. In some embodiments, about 25% to about 75% of the second semiconductor layer 102 adjacent the substrate remains in the channel region. In some embodiments, the portion of the second semiconductor layer 102 adjacent the substrate is removed by suitable selective etching and masking techniques. In some examples, the etching is performed using a plasma formed from HBr and $Cl_2$.

Figure 35:
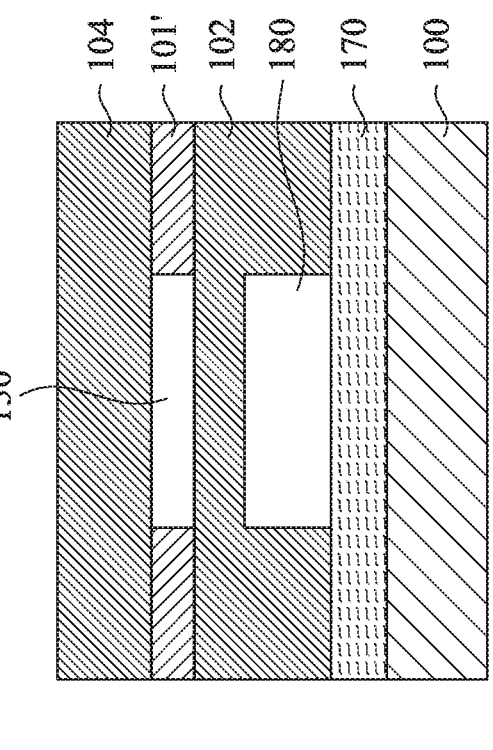
FIG. 35 shows a cross sectional view of one of the various stages of manufacturing a semiconductor FET device according to embodiments of the present disclosure.

Next, the channel portion of the strained first semiconductor layer 101' is selectively removed to create openings 130, as shown in FIG. 35, thereby creating nanowires of the second semiconductor layers 102, 104 in the channel region having a relaxed channel, which are suitable for nFETs or pFETs.

Figure 36:
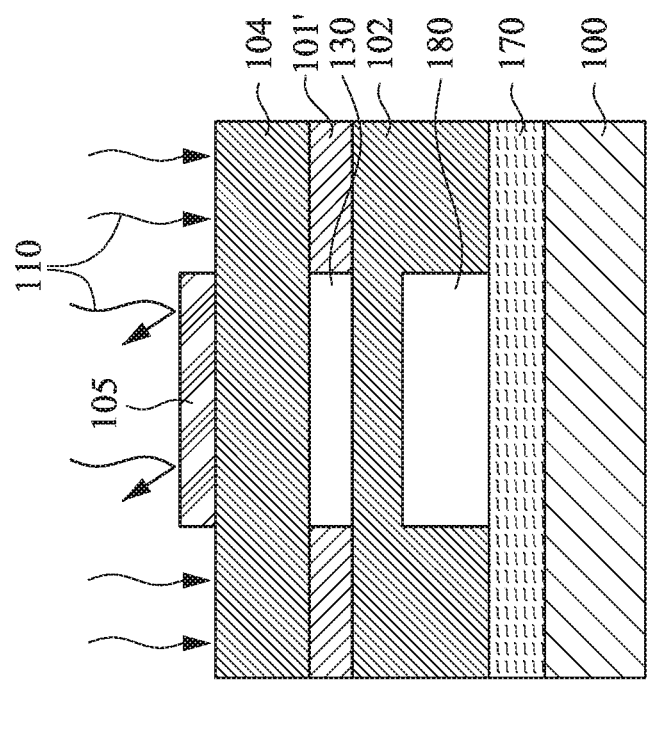
FIG. 36 shows a cross sectional view of one of the various stages of manufacturing a semiconductor FET device according to embodiments of the present disclosure.

A mask layer 105 is subsequently formed over the channel regions of the first semiconductor layers 102, 104, as shown in FIG. 36. The mask layer is made of a reflective material, such as a metal, in some embodiments. In some embodiments, the metal for the mask is selected from the group consisting of aluminum, nickel, gold, platinum, chromium, copper, zinc, and zirconium. The mask layer material may be deposited by CVD, atomic layer deposition (ALD), physical vapor deposition (PVD), electroplating, or other suitable methods, After depositing the mask layer material, the mask layer 105 is formed by suitable photolithographic and etching techniques in some embodiments.

The layer stack is subsequently selectively irradiated with radiation 110 from a radiation source, as shown in FIG. 36. In some embodiments, the radiation source is a laser or a flash lamp, including argon and xenon flash lamps. The layer stack is exposed to the radiation 110 according to any of the conditions previously discussed herein with reference to FIG. 6.

Figure 37:
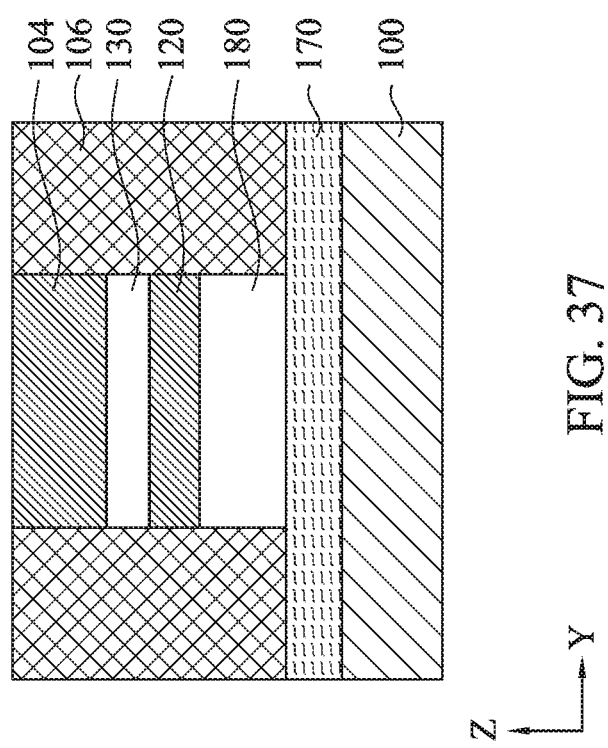
FIG. 37 shows a cross sectional view of one of the various stages of manufacturing a semiconductor FET device according to embodiments of the present disclosure.

The radiation 110 anneals the source/drain regions of the fin structure causing the second semiconductor layers 102, 104 and the first semiconductor layer 101' to combine and form a source/drain stressor region 106, as shown in FIG. 37. The source/drain stressor region 106 is formed in a similar manner as previously discussed herein with reference to FIG. 7.

In some embodiments, the source/drain regions are doped with an appropriate dopant prior to annealing. In such embodiments, the annealing additionally activates the dopants in the source/drain regions. In certain embodiments, the source/drain regions are doped with up to $2 \times 10^{20}$ dopants/$cm^3$. The dopants can be n-type or p-type dopants, including one or more of As, Sb, P, B, Ga, and Al. In some embodiments, in-situ doping is used to incorporate the dopant. In other embodiments, ion-implantation, plasma-doping, solid-phase doping, or other doping techniques are used.

Figure 38:
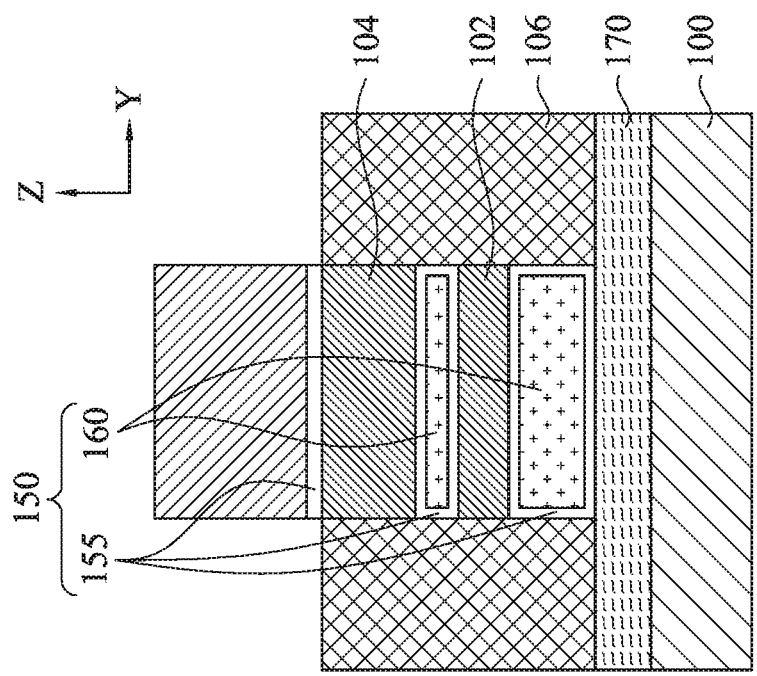
FIG. 38 shows a cross sectional view of one of the various stages of manufacturing a semiconductor FET device according to embodiments of the present disclosure.

After the irradiation, the mask layer 105 is removed using a suitable etching technique, as shown in FIG. 37, and additional processing is performed. Additional processing includes forming a gate electrode structure 150 wrapping around the nanowires 102, 104 in the channel region to form a gate all around field effect transistor (GAA FET), as shown in FIG. 38. The gate electrode structure 150 includes a gate dielectric layer 155 wrapping around the nanowires 102, 104 and a gate electrode layer 160 disposed on the gate dielectric layer wrapping around the nanowires. In some embodiments, an interfacial layer and work function adjustment layers are formed between the gate dielectric layer 155 and the gate electrode layer 160.

In certain embodiments, the gate dielectric layer 155 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 155 may be formed by CVD, ALD, or any suitable method. In one embodiment, the gate dielectric layer 155 is formed using a highly conformal deposition process such as ALD in order to ensure the formation of a gate dielectric layer having a uniform thickness around each channel layers. The thickness of the gate dielectric layer 155 is in a range from about 1 nm to about 6 nm in some embodiments.

The gate electrode layer 160 is formed on the gate dielectric layer 155 to surround each channel layer. The gate electrode layer 160 includes one or more layers of conductive material, such as polysilicon; or a metal, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 160 may be formed by CVD, ALD, electroplating, or other suitable methods.

In certain embodiments of the present disclosure, one or more work function adjustment layers (not shown) are interposed between the gate dielectric layer 155 and the gate electrode layer 160, as previously discussed herein.

The annealing of the source/drain regions of the device in FIG. 36 to produce source/drain stressor regions 106 according to embodiments of the present disclosure provides a compressive strain in the channel region, thereby providing devices with a compressive strain that are suitable for nFETs. Thus, by forming a plurality of devices on a substrate where some of the devices are selectively annealed and other devices on the substrate are not radiation annealed, both nFETs and pFETs can be formed on the substrate according to embodiments of the present disclosure. Thus, the present disclosure provides an improved method for fabricating CMOS devices.

Figure 39:
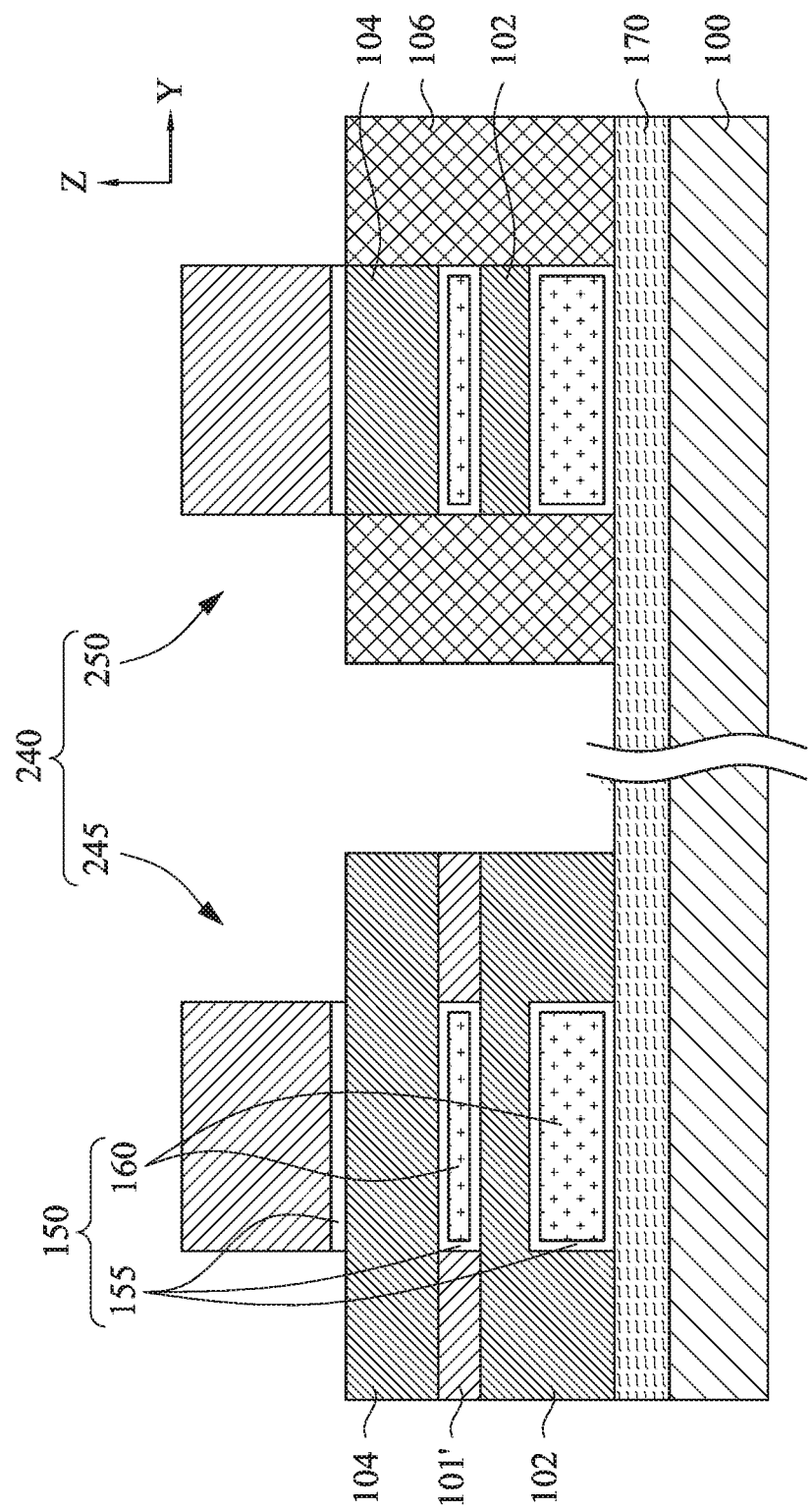
FIG. 39 shows a cross sectional view of a semiconductor FET device according to embodiments of the present disclosure.

An example of a CMOS device 240 according to the present disclosure is illustrated in FIG. 39. As shown in FIG. 39, an nFET 245 having relaxed second semiconductor wires 102, 104 are formed by forming a gate electrode structure 150 in the channel region of the structure of FIG. 35. A pFET 250 is formed by the device of FIG. 38. Both pFET 250 and nFET 245 are formed on a common substrate 100. In some embodiments, a pFET can be formed by the device of FIG. 35 without annealing the source/drain regions. In some embodiments, a buried oxide layer 170 formed on the substrate 100.

In other embodiments of the present disclosure, Table 1 lists pairs of first semiconductor layers and second semiconductor layers are used together where the first semiconductor layer forms the channel nanowire, and the second semiconductor layer combines with the first semiconductor layer to form the source/drain regions.

TABLE 1

| First Semiconductor Layer | Second Semiconductor Layer |
|---|---|
| Si | SiGe |
| SiGe | Ge |
| Ge | GeSn |
| GeSn | Ge |
| Ge | SiGe |
| SiGe | Si |
| Si/SiGe/Ge/GeSn | SiGeSn |
| SiGeSn | Si/SiGe/Ge/GeSn |
| SiGeSn | SiGeSn |

It is understood that additional processing may be performed. Subsequent processing according to embodiments of the disclosure includes forming various contacts/vias/lines and multilayer interconnects features (e.g., metal layers and interlayer dielectrics) on the device, configured to connect the various features or structures of the semiconductor device.

Embodiments of the present disclosure reduce the number of operations required to provide source/drain stressors in semiconductor devices, thereby reducing processing time and cost. Embodiments of the present disclosure provide both compressive and tensile strained semiconductor devices in a simplified GAA FET fabrication method. By using selective annealing both compressive and tensile strain can be obtained with the same structure according to embodiments of the present disclosure. In addition, induced strain can be adjusted in embodiments of the disclosure by adjusting the thickness and composition of the semiconductor layers in a layer stack. Furthermore, dopant activation and source/drain stressor formation can be done simultaneously by selective annealing according to embodiments of the present disclosure. The present disclosure provides a simplified, cost effective method of fabricating CMOS devices.

It will be understood that not all advantages have been necessarily discussed herein, no particular advantage is required for all embodiments or examples, and other embodiments or examples may offer different advantages.

One embodiment of the present disclosure is a method of manufacturing a semiconductor device, including forming a fin structure having a stack of alternating first semiconductor layers and second semiconductor layers on a substrate. The first and second semiconductor layers include first end portions on either side of a second portion along a length of the first and second semiconductor layers. The first and second semiconductor layers are formed of different materials. The second portion of the first semiconductor layers is removed to form spaces. A mask layer is formed over the second portion of an uppermost second semiconductor layer above the spaces. The first portions of first and second semiconductor layers are irradiated with radiation from a radiation source to cause material from the first portions of the first and second semiconductor layers to combine with each other. In an embodiment, the radiation source is a laser. In an embodiment, the laser has a wavelength of about 150 nm to about 2300 nm. In an embodiment, the first and second semiconductor layers are selected from the group consisting of Si, Ge, SiGe, GeSn, Si/SiGe/Ge/GeSn, SiGeSn, and combinations thereof. In an embodiment, the first semiconductor layer includes $Si_xGe_{1-x}$, where $0.1 \le x \le 0.9$, and the second semiconductor layer includes Si or Ge. In an embodiment, a thickness t2 of the second semiconductor layers and a thickness t1 of the first semiconductor layers are related as t2/t1=0.2 to 5. In an embodiment, a thickness is of the first portions where the first and second semiconductor layers combined with each other and a thickness t2 of the second semiconductor layers are related as is/t2=(0.15 to 6)*n, where n=the number of second semiconductor layers. In an embodiment, the method includes removing the mask layer after irradiating the first portions of the first and second semiconductor layers. In an embodiment, the method includes forming a gate electrode structure wrapping around the second semiconductor layers.

Another embodiment of the present disclosure is a method of manufacturing a semiconductor device, including forming a first semiconductor layer on a substrate and forming a second semiconductor layer on the first semiconductor layer. Another first semiconductor layer is formed on the second semiconductor layer, and another second semiconductor layer is formed on the another first semiconductor layer. The first and second semiconductor layers are formed of different materials. The semiconductor layers are patterned to form a fin structure. The fin structure includes channel regions and source/drain regions on each side of the channel regions. A portion of the first semiconductor layers is removed in the channel region. The source/drain regions of the first and second semiconductor layers are selectively exposed to laser radiation. In an embodiment, the laser has a wavelength of about 150 nm to about 2300 nm. In an embodiment, the first and second semiconductor layers are selected from the group consisting of Si, Ge, SiGe, GeSn, Si/SiGe/Ge/GeSn, SiGeSn, and combinations thereof. In an embodiment, the first semiconductor layer includes $Si_xGe_{1-x}$, where $0.1 \le x \le 0.9$, and the second semiconductor layer comprises Si or Ge. In an embodiment, a thickness t2 of the second semiconductor layers and a thickness t1 of the first semiconductor layers are related as t2/t1=0.2 to 5. In an embodiment, a thickness is of the source/drain regions after exposure to laser radiation and a thickness t2 of the second semiconductor layers are related as is/t2=(0.15 to 6)*n, where n=the number of second semiconductor layers. In an embodiment, the method includes forming an insulating layer on the semiconductor substrate before forming the first and second semiconductor layers.

Another embodiment of the present disclosure is a method of manufacturing a semiconductor device, including forming a first semiconductor layer on a substrate, and forming a second semiconductor layer on the first semiconductor layer. Another first semiconductor layer is formed on the second semiconductor layer. The first and second semiconductor layers are formed of different materials. The semiconductor layers are patterned to form a fin structure. The fin structure includes a channel region and source/drain regions on each side of the channel region. A portion of the first semiconductor layer adjacent the substrate in the channel region is removed. A portion of the second semiconductor layer in the channel region is removed. The source/drain regions of the first and second semiconductor layers are selectively exposed to laser radiation. In an embodiment, the first and second semiconductor layers are selected from the group consisting of Si, Ge, SiGe, GeSn, Si/SiGe/Ge/GeSn, SiGeSn, and combinations thereof. In an embodiment, the first semiconductor layer includes $Si_xGe_{1-x}$, where $0.1 \le x \le 0.9$, and the second semiconductor layer comprises Si or Ge. In an embodiment, the method includes forming an insulating layer on the semiconductor substrate before forming the first and second semiconductor layers.

Another embodiment of the present disclosure is a semiconductor device including source/drain regions stressor regions including a mixture of a first semiconductor material and a second semiconductor material. The first and second semiconductor materials are different materials. A plurality of nanowires are formed of the second semiconductor material in a channel region extending between the source/drain regions on each side of the channel region. In an embodiment, the second semiconductor material is selected from the group consisting of Si, Ge, SiGe, GeSn, Si/SiGe/Ge/GeSn, and SiGeSn. In an embodiment, the second semiconductor material is Si or Ge. In an embodiment, the source/drain regions include a mixture of two or more of semiconductor materials selected from the group consisting of Si, Ge, SiGe, GeSn, Si/SiGe/Ge/GeSn, and SiGeSn. In an embodiment, a thickness is of the source/drain regions and a thickness t2 of the second semiconductor material layers in the channel region are related as is/t2=(0.15 to 6)*n, where n=the number of second semiconductor material layers. In an embodiment, the second semiconductor material nanowires in the channel region are strained. In an embodiment, the nanowires and the source/drain regions are formed on a semiconductor substrate, and an insulating layer is located between the semiconductor substrate and the nanowires and source/drain regions. In an embodiment, the insulating layer is an oxide of the substrate. In an embodiment, the semiconductor device includes a gate electrode structure wrapping around the nanowires.

Another embodiment of the present disclosure is a semiconductor device, including a first transistor and a second transistor. Each transistor includes a plurality of nanowires in a channel region extending between source/drain regions on each side of the channel region. The source/drain regions of at least one of the first transistor or second transistor are stressor regions comprising a mixture of a first semiconductor material and a second semiconductor material, and the first and second semiconductor materials are different materials. The nanowires are formed of the second semiconductor material. In an embodiment, the second semiconductor material is selected from the group consisting of Si, Ge, SiGe, GeSn, Si/SiGe/Ge/GeSn, and SiGeSn. In an embodiment, the second semiconductor material is Si or Ge. In an embodiment, the source/drain regions comprise a mixture of two or more of semiconductor materials selected from the group consisting of Si, Ge, SiGe, GeSn, Si/SiGe/Ge/GeSn, and SiGeSn. In an embodiment, a thickness is of the source/drain regions and a thickness t2 of the second semiconductor material layers in the channel region are related as is/t2=(0.15 to 6)*n, where n=the number of second semiconductor material layers. In an embodiment, in the first transistor, the second semiconductor material nanowires are under compressive strain in the channel region. In an embodiment, in the second transistor, the second semiconductor material nanowires are under tensile strain in the channel region. In an embodiment, the first and second transistors are formed on a semiconductor substrate, and an insulating layer is located between the semiconductor substrate and the first and second transistors. In an embodiment, the insulating layer is an oxide layer.

Another embodiment of the present disclosure is a semiconductor device, including a semiconductor substrate, and a p-type field effect transistor (pFET) and an n-type field effect transistor (nFET) formed on the semiconductor substrate. Each of the pFET and nFET includes a plurality of nanowires in a channel region extending between source/ drain regions on each side of the channel region. A gate electrode structure wraps around each of the nanowires. The source/drain regions of at least one of the pFET or nFET are stressor regions including a mixture of a first semiconductor material and a second semiconductor material, and the first and second semiconductor materials are different materials. The nanowires are formed of the second semiconductor material. In an embodiment, the gate electrode structure includes a high-k gate dielectric layer wrapping around each of the nanowires and a metal gate electrode layer wrapping around each of the high-k dielectric layers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    source and drain stressor regions comprising a mixture of a first semiconductor material and a second semiconductor material different from the first semiconductor material disposed on a substrate, wherein a ratio of the first semiconductor material and the second semiconductor material in the mixture are respectively x and 1-x, where x is a value between zero and one, and wherein x increases across a thickness from a bottom to a top of the source and drain stressor regions;
    a plurality of semiconductor nanowires formed of the second semiconductor material disposed in a channel region that extends on the substrate between the source and drain stressor regions, the source and drain stressor regions are in contact with the plurality of semiconductor nanowires;
    a gate dielectric layer disposed on and wrapping around the plurality of semiconductor nanowires in the channel region; and
    a gate electrode layer disposed on the gate dielectric layer and wrapping around the plurality of semiconductor nanowires in the channel region, wherein a thickness of a semiconductor nanowire closest to the substrate is smaller than other semiconductor nanowires.

2. The semiconductor device of claim 1, wherein the first and second semiconductor materials are selected from the group consisting of Si, Ge, SiGe, GeSn, Si/SiGe/Ge/GeSn, SiGeSn, and combinations thereof.

3. The semiconductor device of claim 1, wherein the substrate is selected from the group consisting of Si, Ge, SiGe, GaAs, InSb, GaP, GaSb, InAlAs, InGaAs, GaSbP, GaAsSb, and InP.

4. The semiconductor device of claim 1, wherein the plurality of semiconductor nanowires in the channel region have either a compressive strain or a tensile strain.

5. The semiconductor device of claim 1, wherein a material of the source and drain stressor regions comprises $Si_xGe_{1-x}$, wherein the source and drain stressor regions are graded and x varies from 0.1 to 0.9 across the thickness of the source and drain stressor regions.

6. The semiconductor device of claim 1, wherein a material of the source and drain stressor regions comprises $Si_xGe_{1-x}$, wherein the source and drain stressor regions are graded and x varies from 0 to 1 across the thickness of the source and drain stressor regions, and wherein x is zero at the top of the source and drain stressor regions.

7. The semiconductor device of claim 1, wherein the first semiconductor material and the second semiconductor material are different semiconductor elements.

8. The semiconductor device of claim 1, wherein the gate dielectric layer comprises a high-k gate dielectric layer.

9. A semiconductor device, comprising:
    a first transistor and a second transistor disposed on a substrate, each transistor comprising:
        source and drain regions disposed on the substrate, wherein the source and drain regions of the first transistor are stressor regions comprising a mixture of a first semiconductor material and a second semiconductor material different from the first semiconductor material, wherein a ratio of the first semiconductor material and the second semiconductor material in the mixture are respectively x and 1-x, where x is a value between zero and one, and wherein x increases across a thickness from a bottom to a top of the source and drain regions;
        a plurality of semiconductor nano-structures disposed in a channel region that extends on the substrate between the source and drain regions, the source and drain regions are in contact the plurality of semiconductor nano-structures, wherein the plurality of semiconductor nano-structures of the first transistor are formed of the second semiconductor material;
        a gate dielectric layer disposed on and wrapping around the plurality of semiconductor nano-structures in the channel region; and
        a gate electrode layer disposed on the gate dielectric layer and wrapping around the plurality of semiconductor nano-structures in the channel region, wherein the first transistor is an n-type transistor and the second transistor is a p-type transistor, and wherein the plurality of semiconductor nano-structures in the channel region of the n-type transistor have a tensile strain and the plurality of semiconductor nano-structures in the channel region of the p-type transistor have a compressive strain.

10. The semiconductor device of claim 9, wherein the first and second semiconductor materials are selected from the group consisting of Si, Ge, SiGe, GeSn, Si/SiGe/Ge/GeSn, SiGeSn, and combinations thereof.

11. The semiconductor device of claim 9, wherein a thickness of the gate dielectric layer is in a range from about 1 nm to about 6 nm.

12. The semiconductor device of claim 9, wherein a material of the source and drain stressor regions comprises $Si_xGe_{1-x}$, wherein the source and drain stressor regions are graded and x varies from 0.1 to 0.9 across the thickness of the source and drain stressor regions.

13. The semiconductor device of claim 9, wherein a material of the source and drain stressor regions comprises $Si_xGe_{1-x}$, wherein the source and drain stressor regions are graded and x varies from 0 to 1 across the thickness of the source and drain stressor regions, and wherein x is zero at the top of the source and drain stressor regions.

14. The semiconductor device of claim 9, wherein the gate dielectric layer comprises a high-k gate dielectric layer, and wherein high-k gate dielectric layer comprises one or more of $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy.

15. A semiconductor device, comprising:
an n-type transistor and a p-type transistor disposed on a same substrate, each transistor comprising:
source and drain regions disposed on the substrate, wherein the source and drain regions of the p-type transistor are stressor regions comprising a mixture of a first semiconductor material and a second semiconductor material different from the first semiconductor material;
a plurality of semiconductor nanowires disposed in a channel region on the substrate that extends between the source and drain regions of the n-type transistor and the p-type transistor, the source and drain regions are in contact with the plurality of semiconductor nanowires, wherein the plurality of semiconductor nanowires of the n-type and p-type transistors are formed of the second semiconductor material, wherein the plurality of semiconductor nanowires of the n-type transistor have a tensile strain, and wherein the plurality of semiconductor nanowires of the p-type transistor have a compressive strain;
a gate dielectric layer disposed on and wrapping around the plurality of semiconductor nanowires of the n-type transistor and the p-type transistor in the channel region; and
a gate electrode layer disposed on the gate dielectric layer and wrapping around the plurality of semiconductor nanowires of the n-type transistor and the p-type transistor in the channel region.

16. The semiconductor device of claim 15, wherein the gate dielectric layer of at least one of the n-type or p-type transistors comprises a high-k gate dielectric layer.

17. The semiconductor device of claim 16, wherein high-k gate dielectric layer comprises one or more of $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy.

18. The semiconductor device of claim 15, further comprising an insulating layer disposed between the substrate and the n-type and the p-type transistors.

19. The semiconductor device of claim 15, wherein the first and second semiconductor material are selected from the group consisting of Si, Ge, SiGe, GeSn, Si/SiGe/Ge/GeSn, SiGeSn, and combinations thereof.

20. The semiconductor device of claim 15, wherein a material of the source and drain regions of the p-type transistor comprises $Si_xGe_{1-x}$, wherein the source and drain regions of the p-type transistor are graded and x varies from 0 to 1 across a thickness from a bottom to a top of the source and drain regions, and wherein x is zero at the top of the source and drain regions.

* * * * *